(12) United States Patent
Ohkawa

(10) Patent No.: US 7,819,560 B2
(45) Date of Patent: Oct. 26, 2010

(54) ILLUMINATION DEVICE AND LENS OF ILLUMINATION DEVICE

(75) Inventor: Shingo Ohkawa, Misato (JP)

(73) Assignee: Enplas Corporation, Kawaguchi (JP)

( * ) Notice: Subject to any disclaimer, the term of this patent is extended or adjusted under 35 U.S.C. 154(b) by 0 days.

(21) Appl. No.: 11/790,264

(22) Filed: Apr. 24, 2007

(65) Prior Publication Data

US 2008/0013322 A1      Jan. 17, 2008

(30) Foreign Application Priority Data

Apr. 24, 2006   (JP) .............................. 2006-119361

(51) Int. Cl.
*F21V 5/04*   (2006.01)

(52) U.S. Cl. .................. 362/335; 362/311.01; 362/334; 362/327; 362/340; 362/361

(58) Field of Classification Search ................. 362/311, 362/335, 800, 334, 340, 361, 326
See application file for complete search history.

(56) References Cited

U.S. PATENT DOCUMENTS

| 2006/0027828 | A1 | 2/2006 | Kikuchi | |
|---|---|---|---|---|
| 2006/0066218 | A1* | 3/2006 | Yamaguchi et al. | 313/498 |
| 2006/0083002 | A1* | 4/2006 | Koike et al. | 362/326 |

FOREIGN PATENT DOCUMENTS

| EP | 1 564 819 | 8/2005 |
|---|---|---|
| EP | 1 641 052 | 3/2006 |
| JP | 2004-233788 | 8/2004 |
| JP | 2005-174685 | 6/2005 |
| WO | 2006/089523 | 8/2006 |

OTHER PUBLICATIONS

Extended European Search Report issued in corresponding European Patent Application No. 07251726.1, on Aug. 3, 2007.
European Office Action for corresponding European Application No. 07 251 726.1-2217; dated Nov. 27, 2009.

* cited by examiner

*Primary Examiner*—Sandra L O'Shea
*Assistant Examiner*—Jessica L McMillan
(74) *Attorney, Agent, or Firm*—Staas & Halsey LLP

(57) ABSTRACT

Provided are an illumination device and a lens employed in the device for controlling light travelling direction, the device being capable of illuminating brightly and uniformly a certain limited region (region-to-be-illuminated) corresponding to an object such as subject for photography. The illumination device emits light H coming from a light emitting element (point-like light source) employing a LED as a light emitting source via the lens. A light control emission face of the lens emits light (rays), which is included in light H introduced into the lens through an incidence face thereof and travelling within the lens to the light control emission face without undergoing inner-reflection at any surface of the light control emission face, as illumination light. The light control emission face is configured so that no set of rays included in the illumination light make any crossover at least before reaching a region-to-be-illuminated and rays within a direction range near to a direction of optical axis L have lower light flux density as compared with that in the outside of the direction range.

6 Claims, 20 Drawing Sheets

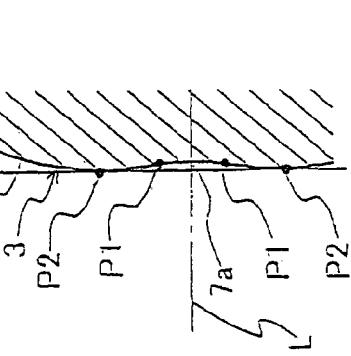
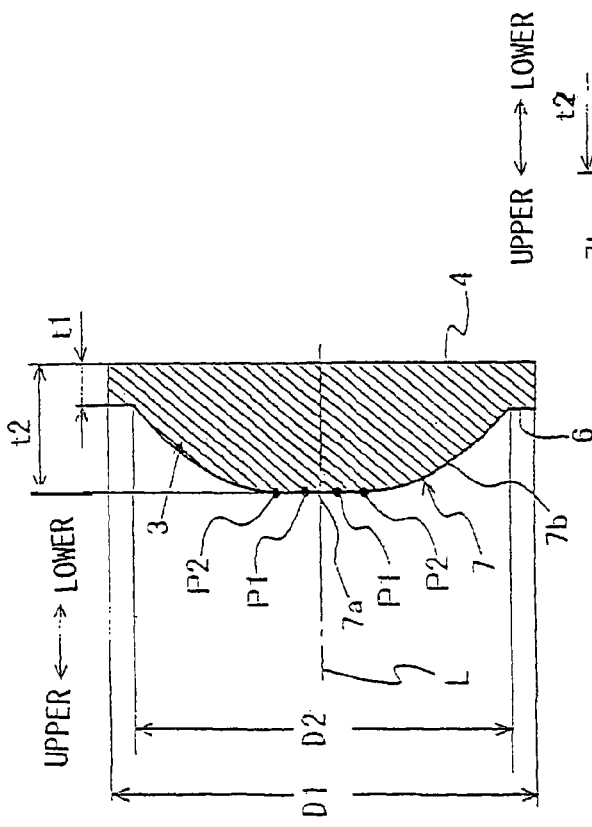
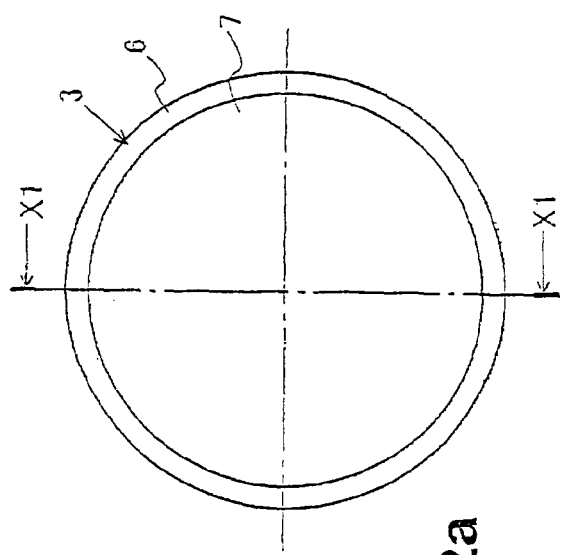
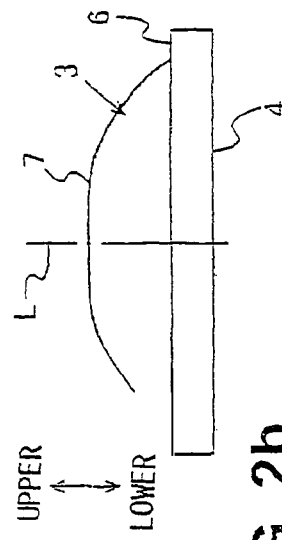
FIG. 2a
FIG. 2b
FIG. 2c
FIG. 2d

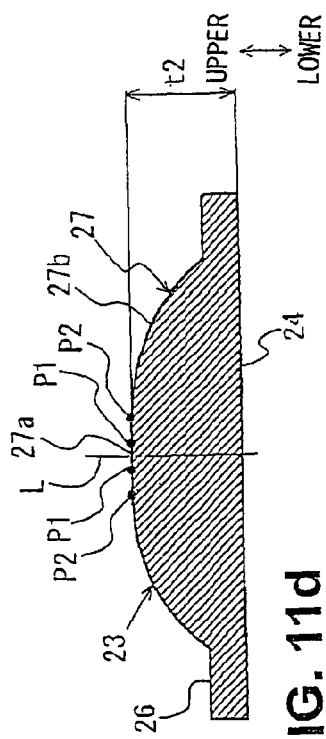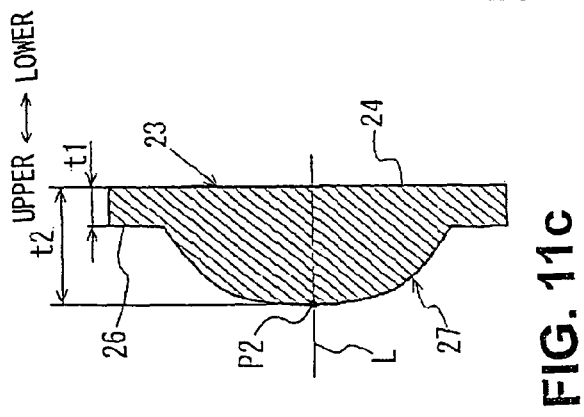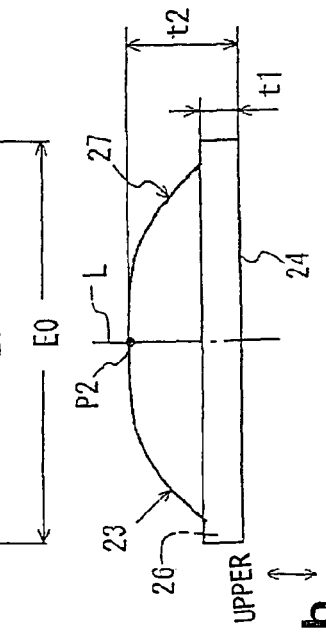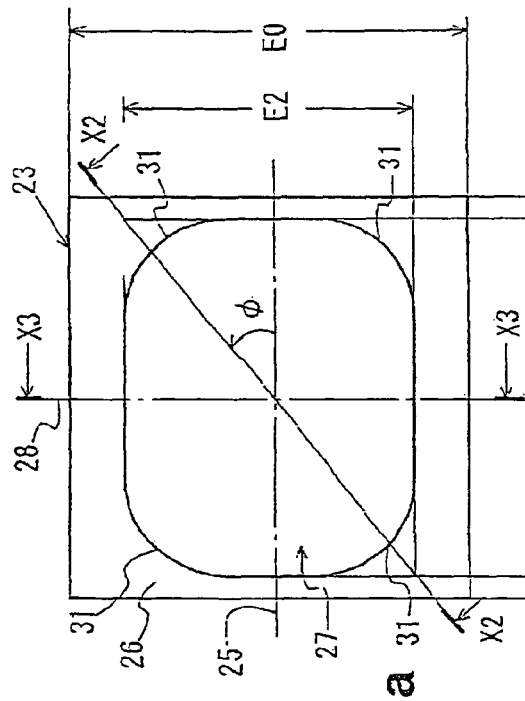
FIG. 11a   FIG. 11b   FIG. 11c   FIG. 11d   FIG. 11e

ILLUMINATION DEVICE AND LENS OF ILLUMINATION DEVICE

BACKGROUND

1. Field of Inventions

The present invention relates to an illumination device for illuminating a certain region-to-be-illuminated with light emitted from a point-like light source and a lens employed in he illumination device, being applied to an illumination devices for electronic-flash-illumination in for portable phones, digital cameras, video cameras or others, or to illumination devices for book-reading illuminators, map illuminators or the likes, and to lenses employed in the devices.

In general, the present invention can be broadly applied to illumination devices which are used for supplying illumination light to a certain limited region-to-be-illuminated like a region corresponding to an object such as subject for photography, and to lenses employed in them for controlling light traveling directions.

2. Related Arts

It is known well to have image-pickup-devices such as portable phones, digital cameras or video cameras be equipped with so-called strobo illumination device for electronic flash illumination as to enable image-pickup in night or dark locations to be available.

It is noted that "strobo illumination" is defined as illumination" using a light source providing light emission synchronized with image pickup. Illumination devices for such uses are required to have ability of illuminating an object-to-be-illuminated (such as a subject for photography) illuminatively and uniformly.

FIG. 21 shows a conventional illumination device used for providing illuminative and uniform illumination, which is disclosed in Document 1 noted below. Referring to FIG. 21. illumination device 101, used for book-reading illuminators or map illuminators, provided illumination light that is supplied to a limited area (i.e. region-to-be-illuminated) such as book-reading surface or map surface. LED 102 is employed as a light source, emitting light which is supplied to a region-to-be-illuminated via lens 103.

Document 1; Tokkai-2005-174685 (JP)

However, if illumination device 101 shown in FIG. 21 is applied to an image pickup device, a problem arises. That is, some of emission rays (irradiation rays) H from emission face 107 of lens 103 cross each other within a region which can be illuminated by illumination device 101, providing crossover portion 104 which looks illuminative locally and gives a reduced evenness of illumination.

Saying more concretely, crossover portion 104 looking like a ring-like illuminative portion emerges in surface-to-be-illuminated 108 which passes crossover portion 104 and extends in parallel with reference plane 106 shown in FIG. 21, causing surface-to-be-illuminated 108 to have a reduced degree of illuminance uniformity.

OBJECT AND SUMMARY OF INVENTION

An object of the present invention is to solve problems of the above-described prior art. Thus the present invention provides an illumination device and a lens employed in the device, the device being capable of illuminating a certain region (called "region-to-be-illuminated" hereafter; for example, a region corresponding to a subject for photography) at a high efficiency as to give a highly uniform illuminance to the region-to-be-illuminated.

First, the present invention is applied to an illumination device, which comprises a point-like light source and a lens to which light emitted from said point-like light source, for emitting light via said lens as illumination light illuminating a region-to-be-illuminated.

According to the present invention, the illumination device is provided with the following features (A) and (B), or (A) and (C).

(A) Said lens has an incidence face directed to said point-like light source and a light control emission face that is located opposite to said incidence face and emits rays which reach said light control emission face after being emitted from said point-like light source and entering into said lens through said incidence face and travelling only within said lens without undergoing inner-reflection at any surface of said lens as said illumination light.

(B) Said light control emission face has a configuration such that no crossover is given by rays included in said illumination at least before said illumination light reaches said region-to-be-illuminated, and light flux density of said illumination light is lower in a direction-range-near-to-optical-axis including a direction of an optical axis of said point-like light source as compared with that in a direction range outside of said direction-range-near-to-optical-axis.

(C) Said light control emission face has a configuration such that no crossover is given by rays included in said illumination at least before said illumination light reaches said region-to-be-illuminated, and a convex portion swelling toward said region-to-be-illuminated is formed in the vicinity of an outer edge of said light control emission face.

Next, the present invention is applied to a lens used in an illumination device which applies direction—control to light emitted from a point-like light source and emits direction—controlled illumination light illuminating a region-to-be-illuminated, for said direction—control.

According to the present invention, the lens is provided with the following features (A) and (B), or (A) and (C).

The present invention avoids crossover portion as described above from being produced within a region (three-dimensional region) between the an emission face (light control emission face) of a lens and a surface-to-be-illuminated.

Emission light of a point-like light source (light emitting element) is emitted radially toward various directions from a point (emission point) which can be regarded substantially as one point. Most of the emitted light travels within the lens without undergoing inner-reflection to an emission face (light control emission face), then being emitted from the light control emission face. It can be said that the emitted light consists of numerous rays emitted from different points on the light control emission face.

Lens configuration employed in the present invention avoids the rays from having travelling directions crossed each other in a region which can be substantially illuminated (i.e. a three-dimensional region through which the rays proceed from the light control emission face to the surface-to-be-illuminated).

In addition, light flux density of the light emitted from the light control emission face is greater in a direction-range deviated from a direction-range-near-to-optical-axis than that in the direction-range-near-to-optical-axis. In other words, comparing light flux density (i.e. light energy per unit cross section perpendicular to light proceeding direction) of rays directed to a frontal direction and around the frontal direction with those directed to directions deviated from them (i.e. directions inclined with respect to the optical axis), the latter is greater than the former.

Taking into account (a) "a surface to be irradiated by illumination light is remote from an illumination device at a roughly constant in distance (distance along the optical axis) in practical cases" and (b) emission rays outputted radially from a light control emission face, rays emitted toward directions (oblique directions) angularly deviated from a frontal direction (optical axis direction) of the illumination device are incident the surface to be irradiated at a largely inclined angle. Therefore, obliquely emitted rays as above are required to have a greater flux density (energy density) as compared with that of light emitted toward the frontal direction in order to uniformize illuminance (i.e. to make illuminance approximately constant) on the surface to be irradiated.

The present invention is able to satisfy such requirement. That is, the region-to-be-illuminated avoids from having an illuminance reduction which could appear in an area deviated from the frontal direction, resulting in uniformalized illuminance over surface-to-be-illuminated.

It is noted that "optical axis" is defined as a straight line corresponding to a center direction of emission flux emitted three-dimensionally from a point-like light source in the present specification, and a direction giving the strongest emission generally accords with the optical axis.

BRIEF DESCRIPTION OF DRAWINGS

FIG. 2a is a plan view of a lens employed in the illumination device shown in FIG. 1;

FIG. 2b is a side view of the same lens;

FIG. 2c is a cross section view along line X1-X1 in FIG. 1a;

FIG. 2d is a partially enlarged view of FIG. 2c;

FIG. 11a is a plan view of a lens employed in the illumination device shown in FIG. 10;

FIG. 11b is a side view of the same lens;

FIG. 11c is a cross section view along line X3-X3 in FIG. 11a;

FIG. 11d is a cross section view along line X2-X2 in FIG. 11a;

FIG. 11e is a partially enlarged view of FIG. 11d;

FIG. 19c is a cross section view along line X4-X4 in FIG. 19a;

FIG. 20c is a cross section view along line X5-X5 in FIG. 20a; and,

EMBODIMENTS

Figure 1:
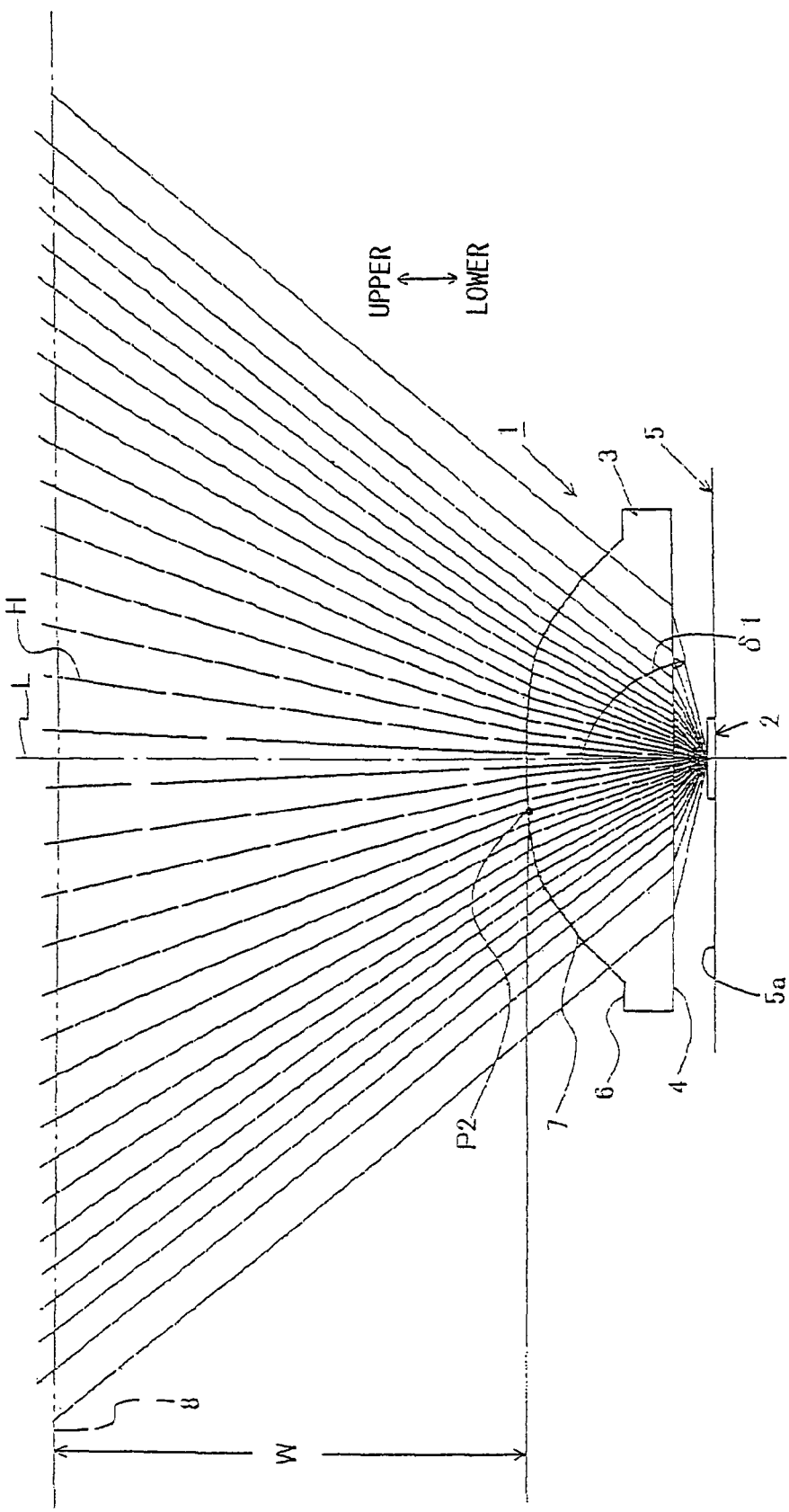
FIG. 1 is a diagramic view of an illumination device in accordance with a first embodiment of the present invention.

Embodiments in accordance with the present invention are described below based on the drawings First Embodiment FIG. 1 is a diagramic view of an illumination device in accordance with a first embodiment of the present invention. Referring to FIG. 1, illumination device 1 outputs light (rays) H from light emitting element (point-like light source) 2 via lens 3, illuminating surface-to-be-illuminated 8. It is noted that "surface-to-be-illuminated 8" is a surface set in a region which can be illuminated by illumination device 1. For instance, if illumination device 1 is a strobo-illuminator for camera, the surface is set in the greatest region which can be illuminated by the strobo-illuminator, namely, "an imaginary surface set at a position located within an irradiation distance in which strobo illumination is allowed to function substantially". Light emitting element 2 is a point-like light source, employing a LED (not shown) sealed by resin. It is noted that resin for sealing may contain fluorescent substance as required.

Lens 3 is configured as illustrated in FIGS. 2a to 2d, being made of a transparent material such as PMMA (polymethyl methacrylate), PC (polycarbonate) or EP (epoxy resin) or silicone resin, or transparent glass.

As shown in FIGS. 1 and 2a to 2d, lens 3 has a shape like a disk in plan, being provided with a lower face (incidence face) 4 which is directed to light emitting element 2 and extends parallel with a surface (reference plane) 5a of substrate 5 on which light emitting element 2 is mounted.

In addition, lens 3 is provided with flange-like-portion 6 having width and thickness which are constant along an outer periphery. An outer face located inside of flange-like-portion 6 provides light control emission face 7. It is noted that flange-like-portion 6 can be engaged with a clamping member (such as clip) for fixing lens 3 to substrate 5.

Light control emission face 7 consists of a first emission face 7a located within a certain range (between P1 AND P2) around optical axis L as a center and a second emission face 7b formed around first emission face 7a continuously. First emission face 7a provides a smoothly curved convex configuration swelling downward. Second emission face 7b provides a smoothly curved convex configuration swelling upward, being formed as to be connected continuously with first emission face 7a and to surround first emission face 7a.

Figure 5:
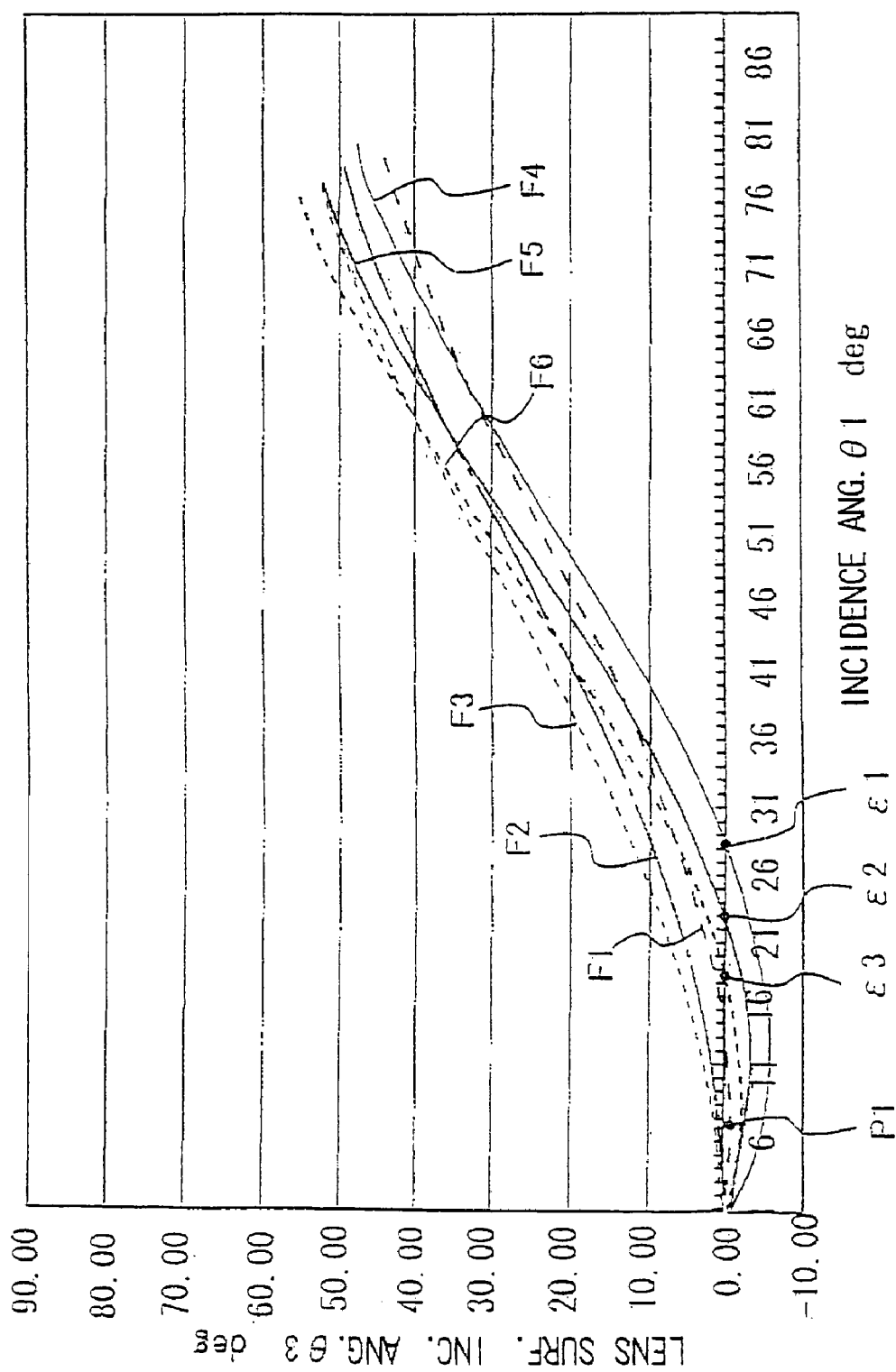
FIG. 5 is a graph showing a relation between incidence angle $\theta 1$ and lens face inclination angle $\theta 3$.

In addition, first emission face 7a and second emission face 7b are connected smoothly, providing a connection portion between both emission faces 7a, 7b corresponding to inflection point P (See FIG. 5).

Light control emission face 7 is formed as to cover at least a region corresponding to "half-intensity-angular-range".

It is noted that "half-intensity-angular-range" is an "angular range from an optical axis direction (i.e. a direction along an optical axis L), toward which light emitting element 2 emits light of the maximum intensity is emitted, to an emission direction giving a half of the maximum intensity".

In other words, if light of light emitting element 2 emitted toward within half-intensity-angular-range is incident, reaches (make an inner-incidence) light control emission face 7 without fail.

Figure 3:
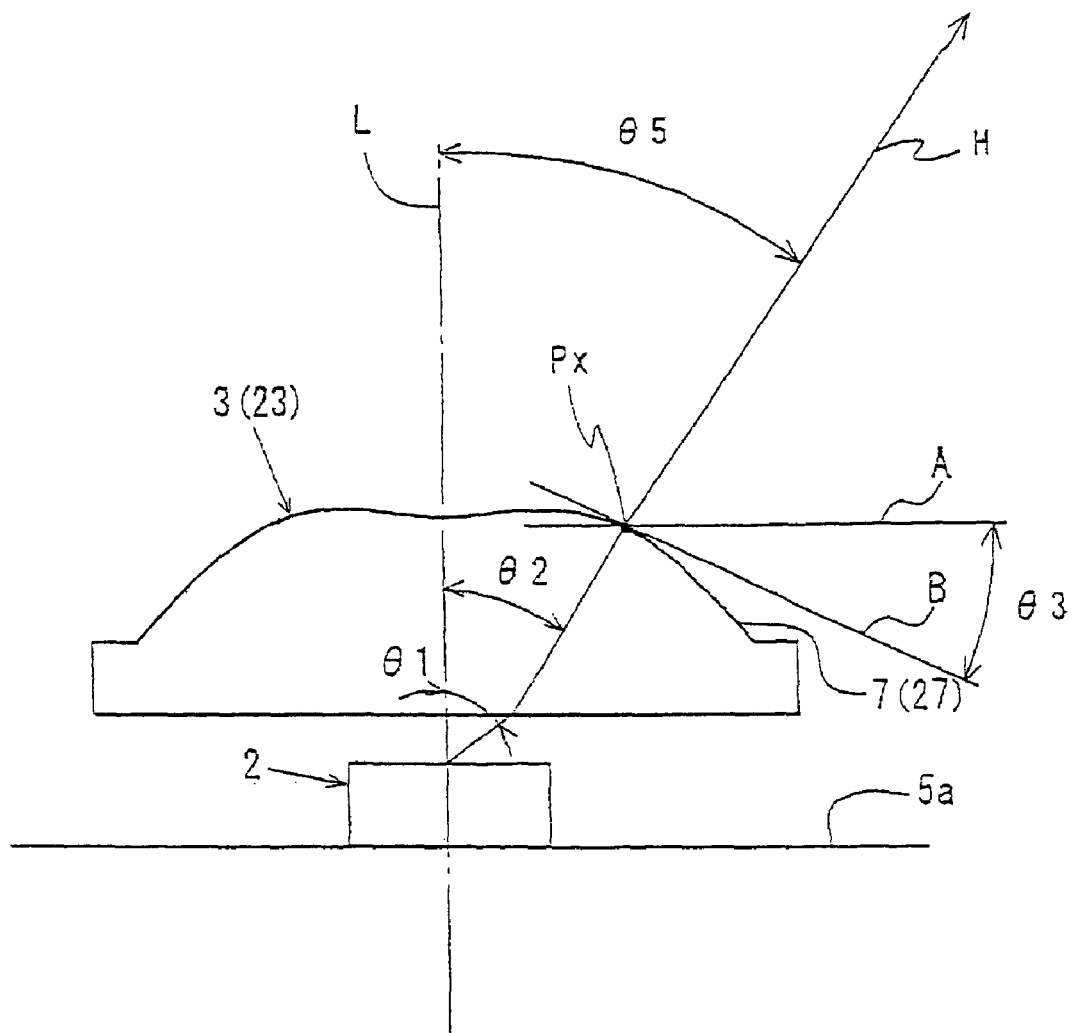
FIG. 3 is a partial cross section view of the illumination device along a plane including an optical axis of light emitting element, being used for explaining parameters ($\theta 1$, $\theta 2$, $\theta 3$, $\theta 5$ an others)

Light control emission face 7 is described in detailed based on FIG. 3. In connection with FIG. 3, the following definitions are employed.

Reference plane 5a=horizontal plane perpendicular to optical axis L of light emitting element 2.

Position Px=position on light control emission face 7 from which light H is emitted after inner-travelling in lens 3 (a crossing point made by light H and light control emission face 7 in the cross section shown by FIG. 3).

Straight line A=straight line which passes point Px and extends parallel with reference plane 5a.

Incidence angle θ1=angle made by light H from light emitting element 2 and optical axis L.

Angle θ2=angle made by light H in lens 3 and optical axis L.

Angle θ3=angle made by straight line A and tangent line B of light control emission face 7 at position Px.

Emission angle θ5=emission angle of light H at being emitted from light control emission face 7 (angle made by light H and optical axis L).

Light control emission face 7 shown in FIG. 3 is configured so that an efficient irradiation without local conspicuous bright illuminating is applied at least to surface-to-be-illuminated 8 that is an area to which the rays emitted toward included in half-intensity-angular-range, which are included in light H emitted from light emitting element 2, are able to incident after being emitted from light control emission face 7 (See FIG. 1). It is noted that half-intensity-angular-range is shown in FIG. 1 as a range from a direction of optical axis L to angle δ1.

That is, angle δ1 is an angle which gives a half value of intensity in FIG. 1. Expression of half-intensity-angular-range using a range of θ1, ‖θ1‖<δ1. It is noted that symbol ‖ ‖ means an absolute value. Surface-to-be-illuminated 8 has a range corresponding to half-intensity-angular-range.

Figure 4:
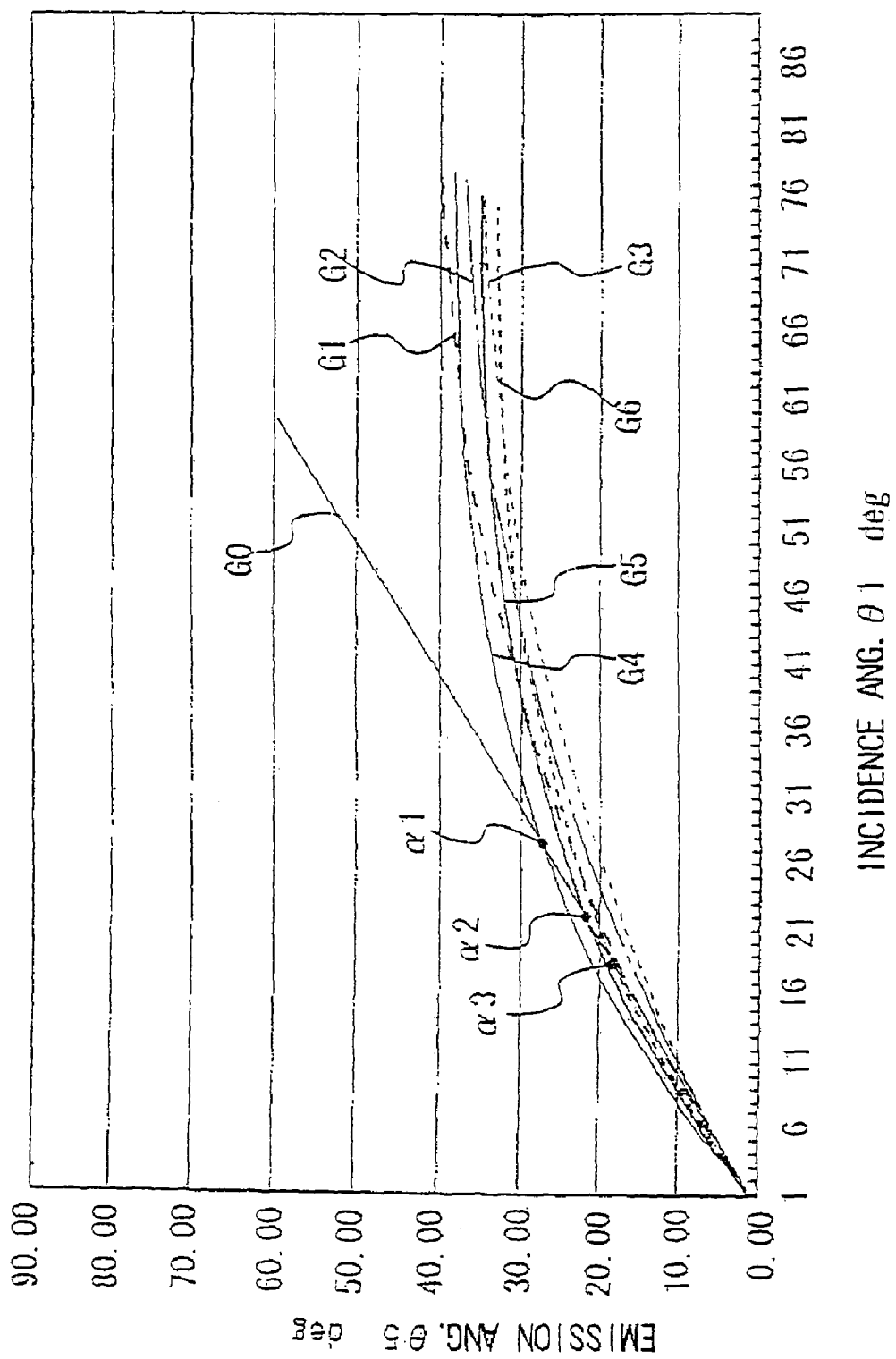
FIG. 4 is a graph showing a relation between incidence angle $\theta 1$ and emission angle $\theta 5$.

FIG. 4 is a graph a relation between incidence angle θ1 and emission angle θ5, wherein line G1 a relation between θ1 and θ5 of this embodiment. Provided that k is a constant for expressing difference in illuminance between a center portion and periphery portion of a region-to-be-illuminated (for example, region-to-be-illuminated 10 shown in FIG. 3), θ5 can be expressed by Formula 1 below and θ3 can be expressed by Formula 2 below in a range of θ1<δ1.

It is noted that k is a constant for expressing difference in illuminance between a center portion and periphery portion of region-to-be-illuminated (for example, region-to-be-illuminated 10 shown in FIG. 3).

Figure 6:
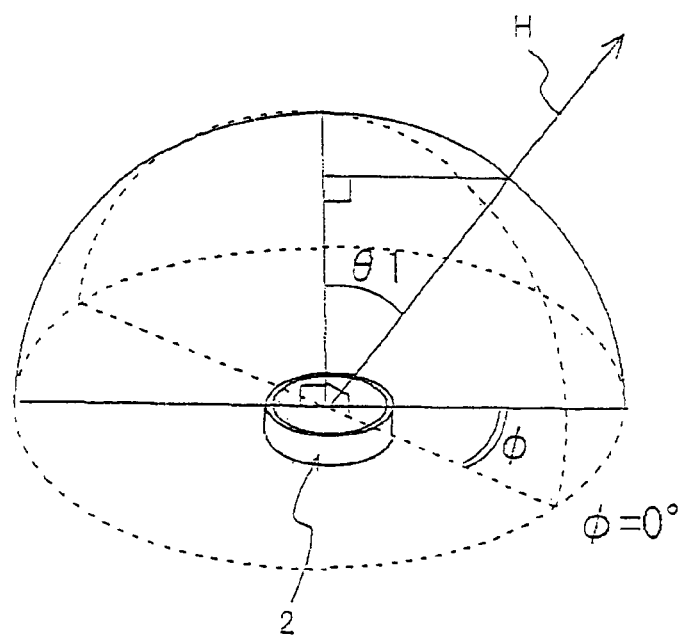
FIG. 6 is a diagram illustrating rotation angle $\phi$ in a plane parallel with reference plane.

In addition, angle θ' is a limit angle (giving the maximum of θ5) which depends on rotation angle φ as shown in FIG. 6. In this embodiment, angle θ' is a constant value (θ'=40°; See dotted line m1 in FIG. 7).

$$\theta 5 = [1 - \{((\pi/2) - \theta 1)/(\pi/2)\}^k] \times \theta' \quad \text{Formula 1}$$

(where θ1<δ1)

$$\theta 3 = \tan^{-1}\{(\sin\theta 5 \cdot n \cdot \sin\theta 2)/(\cos\theta 5 \cdot n \cdot \cos\theta 2)\} \quad \text{Formula 2}$$

(where n is refractive index of lens 3)

In the above Formula 2, θ2 is given, in general, as a function of θ1. This is expressed by θ2=f(θ1). Concretely saying, f(θ1) depends on what incidence face lens 3 does have. If lens has a flat and straight incidence face, θ2 can be expressed as follows.

$$\theta 2 = \sin^{-1}\{\sin\theta 1/n\}$$

(where n is refractive index of lens 3)

As shown by curve F1 in FIG. 5, θ3 determined as above decreases gradually, in a range from optical axis L to θ1=P1, according to increasing of θ1 and increases gradually, in a range of θ1>P1, according to increasing of θ1.

Illumination light (output light) outputted from illumination device 1 is consists of numerous rays emitted from mutually different points on light control emission face 7. As shown in FIG. 1, the rays produce no crossover between light control emission face 7 and region-to-be-illuminated 10 in this embodiment.

That is, rays emitted from positions different to each other are avoided from crossing each other before reaching a region (region-to-be-illuminated 10) which can be illuminated substantially by light outputted from lens 3 (i.e. illumination light).

As a result, problem such that some of emission (illumination light) looks conspicuously bright like a ring is avoided from arising, which is different from the prior art ((See FIG. 21) which can have crossover. Therefore, improved is uniformity in illuminance in region-to-be-illuminated 10 of surface-to-be-illuminated 8.

Figure 8:
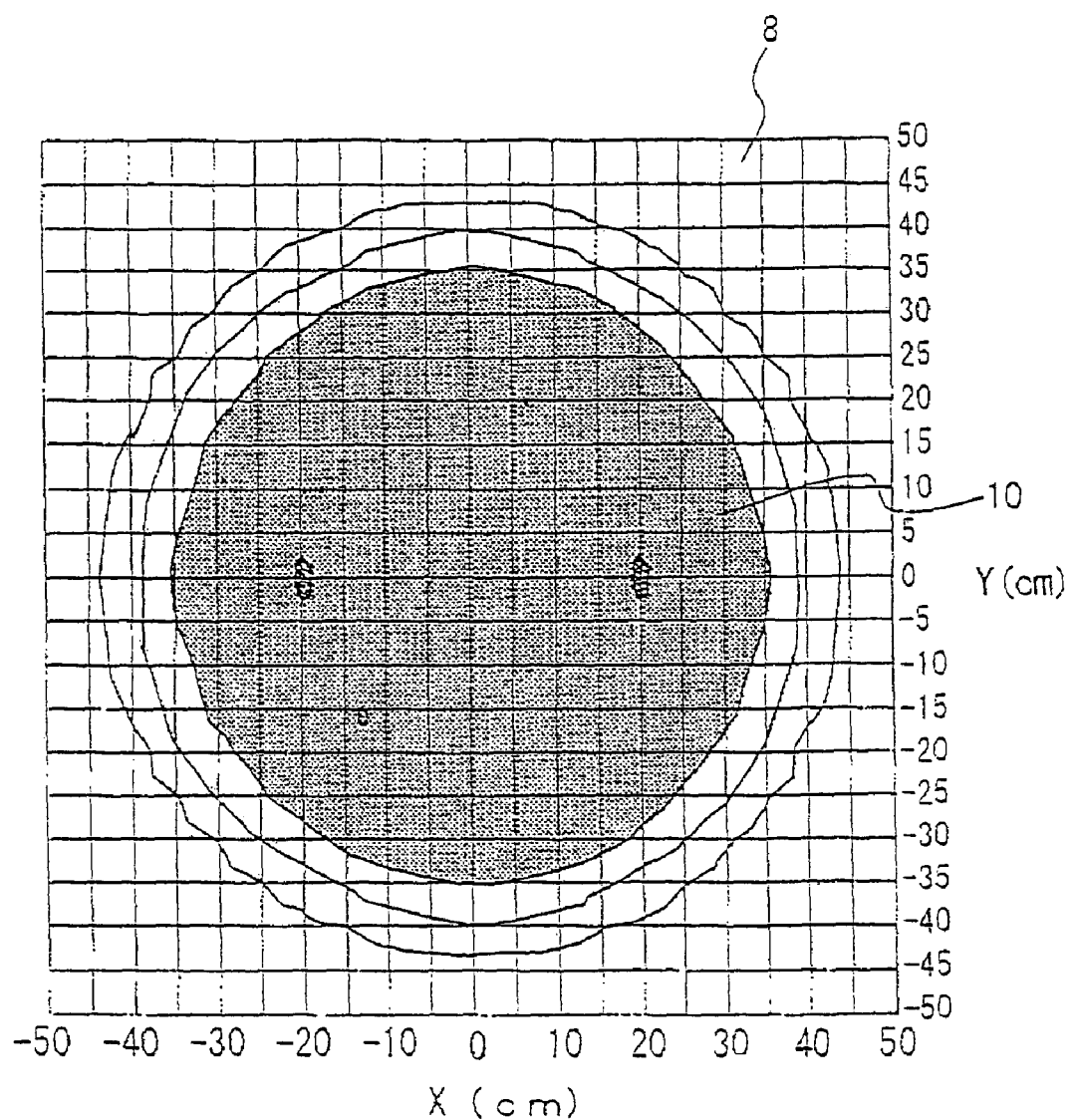
FIG. 8 is a diagram showing an illuminance distribution obtained in a case where a surface-to-be-illuminated is illuminated by an illumination device in accordance with the first embodiment.

Next, a concrete example of this embodiment is described based on FIGS. 1, 3 and 8 for the sake of more intensive understanding of this embodiment. It is noted that FIG. 8 shows an illuminance distribution measured in a case where lens 3 shown in FIGS. 2a to 2d is employed. The following values are examples, putting no limitation on the present invention. In FIGS. 2c, 2d, values of lens 3 are as follows.

D1; outer diameter of flange portion 6=5 mm

D2; outer diameter of light control emission face 7=4.439 mm t1; thickness of flange portion 6=0.5 mm t2; thickness of lens 3 (distance from lower face 4 to top portion P2 of light control emission face 7)=1.46 mm As shown in FIG. 1, illumination device 1 employing lens 3 of the above values involves distance W from top portion P2 of lens 3 to surface-to-be-illuminated (a plane) 8, which is set so that W=50 cm.

An illuminance distribution of region-to-be-illuminated 10 in surface-to-be-illuminated 8 is shown in FIG. 8. Light H from light emitting element 2 enters into lens 3 and is emitted from points on light control emission face 7, becoming illumination light. A region (three-dimensional region) which illumination light passes before reaching region-to-be-illuminated 10 can be regarded as "a region allowing substantially to be illuminated". Hereafter, this is called "illumination-allowing-region". Illumination device 1 employing lens 3 of the above values performs characteristics (1) and (2) below.

(1) Emission in half-intensity-angular-range ($\|\theta 1\|<\delta 1$) give no crossing (i.e. no crossover) in an illumination-allowing-region.

(2) A greater flux density (energy density per unit cross section) of light after emission from light control emission face 7 is obtained outside of the vicinity of optical axis L (i.e. locations far from optical axis L). In other words, flux density of emission (illumination light) from light control emission face 7 gets greater ((See FIG. 1) away from optical axis L except in an area along a periphery of a region-to-be-illuminated ((See FIG. 8).

As a result, illumination device 1 can cause a generally circular area (region-to-be-illuminated 10) having a diameter of approximately 70 cm in surface-to-be-illuminated 8 (See FIG. 8) to be illuminated with a generally uniform illuminance.

According to this embodiment described above, light which is emitted from a light emitting point (one point) of light emitting element 2 toward various directions and reaches light control emission face 7 after traveling within lens 3 without being effected by reflection produces no crossover of rays at least in an "illumination-allowing-region". In other words, "direct emission" satisfies the above (1) and (2). It is noted that "direct emission" is defined as light which is included in the emission (rays) from light emitting element 2 and reaches light control emission face 7 after traveling within lens 3 without undergoing inner-reflection at a boundary between lens 3 and the outside of lens 3 (i.e. lens surface) after entering into lens 3.

Therefore, no ring-like local brightening (abnormal brightening part) is produced, which is different from the prior art ((See FIG. 21) in which some rays cross each other in an illumination-allowing-region, with the result that region-to-be-illuminated 10 in surface-to-be-illuminated 8 is irradiated by a more uniform light.

In addition, according to this embodiment, lens 3 applies light gathering operation (i.e. function of converging light flux) as a whole to light emitted from light emitting element 2. Therefore, a reduced quantity of light reaches a part deviated from a desirable region-to-be-illuminated 10, as compared with a case without lens 3 (direct illumination by light emitting element 2). As a result, illumination efficiency of region-to-be-illuminated 10 is improved.

Second Embodiment

Figure 10:
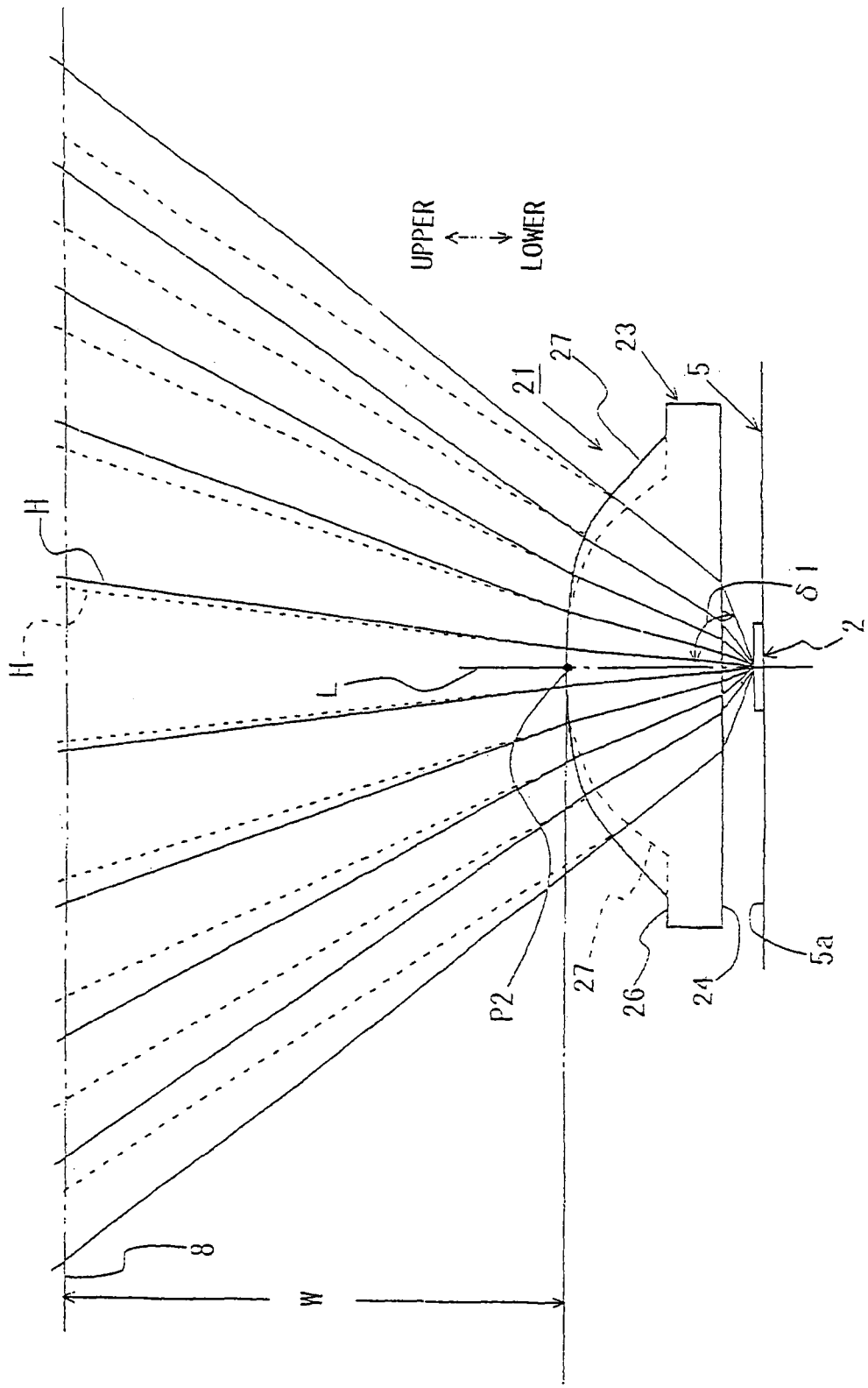
FIG. 10 is a diagramic view of an illumination device in accordance with a second embodiment of the present invention.

FIG. 10 is a diagrammatic view of an illumination device 21 in accordance with a second embodiment of the present invention. As shown in FIG. 10, illumination device 21 outputs light H from light emitting element 2 via lens 23 in generally the same way as the first embodiment. However, lens 23 employed in illumination device 21 is configured differently as compared with lens 3 employed in illumination device 1 of the first embodiment.

FIG. 11a is a plan view of a lens employed in the illumination device shown in FIG. 10 and FIG. 11b is a side view of the same lens. FIG. 11c is a cross section view along line X3-X3 in FIG. 11a. FIG. 11d is a cross section view along line X2-X2 in FIG. 11a and FIG. 11e is a partially enlarged view of FIG. 11d.

First, lens 3 has a shape like a square in plan as shown in FIG. 10a, being provided with a lower face (incidence face) 4 which is directed to light emitting element 2 and extends parallel with a surface (reference plane) 5a on which light emitting element 2 is mounted.

In addition, lens 23 is provided with light control emission face 27 like a rectangle in plain and flange-like-portion 26 formed as to surround light control emission face 27. The rectangle shape in plan of light control emission face 27 corresponds to a shape in plan of a region-to-be-illuminated of surface-to-be-illuminated 8 (a subject for photography).

Further, flange-like-portion 26 has a constant thickness, being able to be engaged with a clamping member (such as clip) for fixing lens 23 to substrate 5. It is noted that lens 23 may be made of the same material as that of lens 3 employed in the first embodiment.

Light control emission face 27 has a profile looking like a smooth curve swelling upward (i.e. toward the side of surface-to-be-illuminated 8) as viewed from a direction perpendicular to center line 25 giving rotation angle $\phi=0°$.

In addition, light control emission face 27 consists of a first emission face 27a located within a certain range (between P1 AND P1) around optical axis L as a center and a second emission face 27b formed around first emission face 27a continuously. It is noted that a diagonal direction of light control emission face 27 in this embodiment corresponds to a direction giving $\phi=35°$, namely, line X2-X2.

First emission face 27a provides a smoothly curved convex configuration swelling downward (toward the side of incidence face 24). Second emission face 27b provides a smoothly curved convex configuration swelling upward, being formed as to be connected continuously with first emission face 27a and to surround first emission face 27a.

These first emission face 27a and second emission face 27b are connected smoothly, providing a connection portion between both emission faces 27a, 27b corresponding to inflection point (P1). Light control emission face 27 provides a smoothly curved surface swelling upward as shown in FIG. 11c. It is noted that center line 28 giving $\phi=90°$ corresponds to line X3-X3.

Light control emission face 27 is formed as to cover at least a region from which light falling in "half-intensity-angular-range" is emitted. It is noted that light control emission face 27 shown by dotted line in FIG. 10 shows light control emission face 27 which is shown in FIG. 11c correspondingly.

A relation between incidence angle $\theta 1$ and emission angle $\theta 5$ ((See FIG. 3) for light control emission face 27 is described below based on FIG. 4.

In FIG. 4, curve G2 gives a relation between $\theta 1$ and $\theta 5$ for light control emission face 27 on center line 25 giving rotation angle $\phi$, which is shown in FIGS. 6 and 11a, equal to 0° ($\phi=0°$).

As shown by curve G2, light control emission face 27 is formed so that at least light which is included in the emission of light emitting element 2 and falls in a half-intensity-angular-range (See FIG. 10; a range of $\theta 1<\delta 1$ in FIG. 3) produces no crossover in an illumination light. This causes surface-to-be-illuminated 8 set in a region that can be illuminated by light emitted from light control emission face 27 to have no locally and conspicuously brightened part. In other words, region-to-be-illuminated 30 (See FIG. 12) in surface-to-be-illuminated 8 is illuminated uniformly. It is noted that angle $\delta 1$ is an angle corresponds to boundary between half-intensity-angular-range and the outside thereof in FIGS. 3 and 10.

In addition, curve G1 shown by dotted line in FIG. 4 gives a relation between $\theta 1$ and $\theta 5$ on line x2-x2 for light control emission face 27 in a case where rotation angle $\phi=35°$ ((See FIGS. 6 and 11a). This curve G1 accords with G1 giving a relation between θ1 and θ5 for light control emission face 7 of lens 3 employed in the first embodiment.

In FIG. 4, dotted curve G3 gives a relation between θ1 and θ5 on for light control emission face 27 in a case where rotation angle φ=90° ((See FIGS. 6 and 11a).

Curves G1 to G3 are set so that values of θ5 for the same θ1 of lines G3, G2 and G1 get greater in order under considering what range (i.e. distance from optical axis L to an outer edge of a region-to-be-illuminated) should be illuminated.

Provided that k is a constant for expressing difference in illuminance between a center portion and periphery portion of a region-to-be-illuminated, θ5 can be expressed by the foresaid Formula 1 in a range of θ1<δ1. Angle θ3 can be expressed by the foresaid Formula 2.

It is noted that θ' is a limit angle (giving the maximum of θ5) which depends on rotation angle φ as shown by curve m2 in FIG. 76, being set as to give the maximum at a rotation angle φ (φ=35° in the case shown in FIG. 7) between φ=0° and φ=90°.

The relation between θ1 and θ3 for light control emission face 27 determined according to the foresaid Formula 2 is such as shown by curved F1 to F3, giving difference depending on rotation angle φ.

That is, in FIG. 5, curve F1 giving a relation between θ1 and θ3 for light control emission face 27 under a condition that rotation angle φ shown in FIGS. 6 and 11a is equal to 35° (φ=35°) shows a gradual falling within a range of 0<θ1≦P1 in half-intensity-angular-range (θ1=0~δ; See FIGS. 11d and 1e) with increasing of θ1, and shows a gradual rising within a range of θ1>P1 within in half-intensity-angular-range (θ1=0~δ) with increasing of θ1. This changing is similar to curve F1 giving a relation between θ1 and θ3 for light control emission face 7 of lens 3 employed in the first embodiment.

In addition, curve F2 shown in FIG. 5 gives a relation between θ1 and θ3 for light control emission face 27 under a condition that rotation angle φ(See FIGS. 6 and 11a) is equal to 0° (φ=0°). Curve F2 shows a gradual rising in the whole of half-intensity-angular-range of θ1=0~δ, with increasing of θ1.

Further, curve F3 shown in FIG. 5 gives a relation between θ1 and θ3 for light control emission face 27 under a condition that rotation angle φ is equal to 90° (φ=90°). Although θ3 show a gradual rising in the whole of half-intensity-angular-range of θ1=0~δ, with increasing of θ1 in generally the same manner as curve F2, the rising shows a greater rising rate as compared with that of curve F2.

Curves F1 to F3 are set so that values of θ3 for the same θ1 of lines F1, F2 and F3 get greater in order under considering what range (i.e. distance from optical axis L to an outer edge of a region-to-be-illuminated) should be illuminated.

Figure 7:
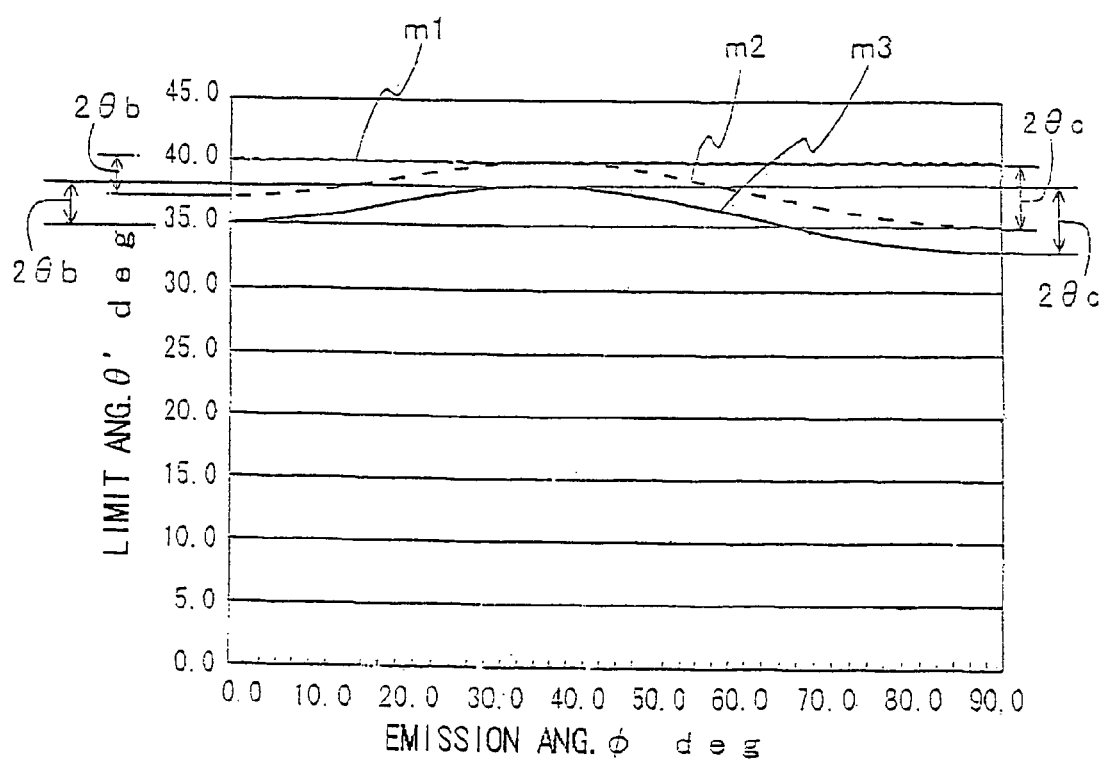
FIG. 7 is a graph showing a relation between rotation angle $\phi$ and limit angle $\theta'$.

In this embodiment, θ' changes smoothly depending on rotation angle φ as shown by curve m2 in FIG. 7.

Now provided is that the maximum of θ' in range of rotation angle φ=0° to 90° is θa. In this embodiment, θ' gives the maximum, θa=40°, when rotation angle φ=35°(rotation angle φa corresponds to a diagonal of lens 3). Using this θa, it can be said that value of θ' when rotation angle φ=0° is obtained by applying θb=1.5° as correction quantity to θa. In addition, it can be said that value of θ' when rotation angle φ=90° is obtained by applying θc=21.5° as correction quantity to θa.

It is noted that θ' is expressed by Formula 3 below in a range of φ>φa (90°≧φ>φa). In addition, θ' is expressed by Formula 4 below in a range of φ≦φa (0°≦φ≦φa).

$$\theta'=\theta a-\theta c\times\sin[\pi\times\{(\phi-\phi a)/((\pi/2)-\phi a)\}-(\pi/2)]-\theta c \quad \text{Formula 3}$$

(where φ>φa)

$$\theta'=\theta a-\theta b\times\sin[\pi\times\{(\phi a-\phi)/(\phi a-(\pi/2))\}-(\pi/2)]-\theta b \quad \text{Formula 4}$$

(where φ≦φa)

Illumination device 21 of this embodiment also has light control emission face 27 from different points of which light H is directed to surface-to-be-illuminated 8 without producing cross on the way, as shown in FIG. 10. Therefore, no conspicuous locally bright area like a ring appears, with the result that rectangular region-to-be-illuminated 30 in surface-to-be-illuminated 8 is irradiated uniformly ((See FIG. 12), which is different from the prior art ((See FIG. 21) in which rays emitted from emission face 107 of lens 103 cross.

Figure 12:
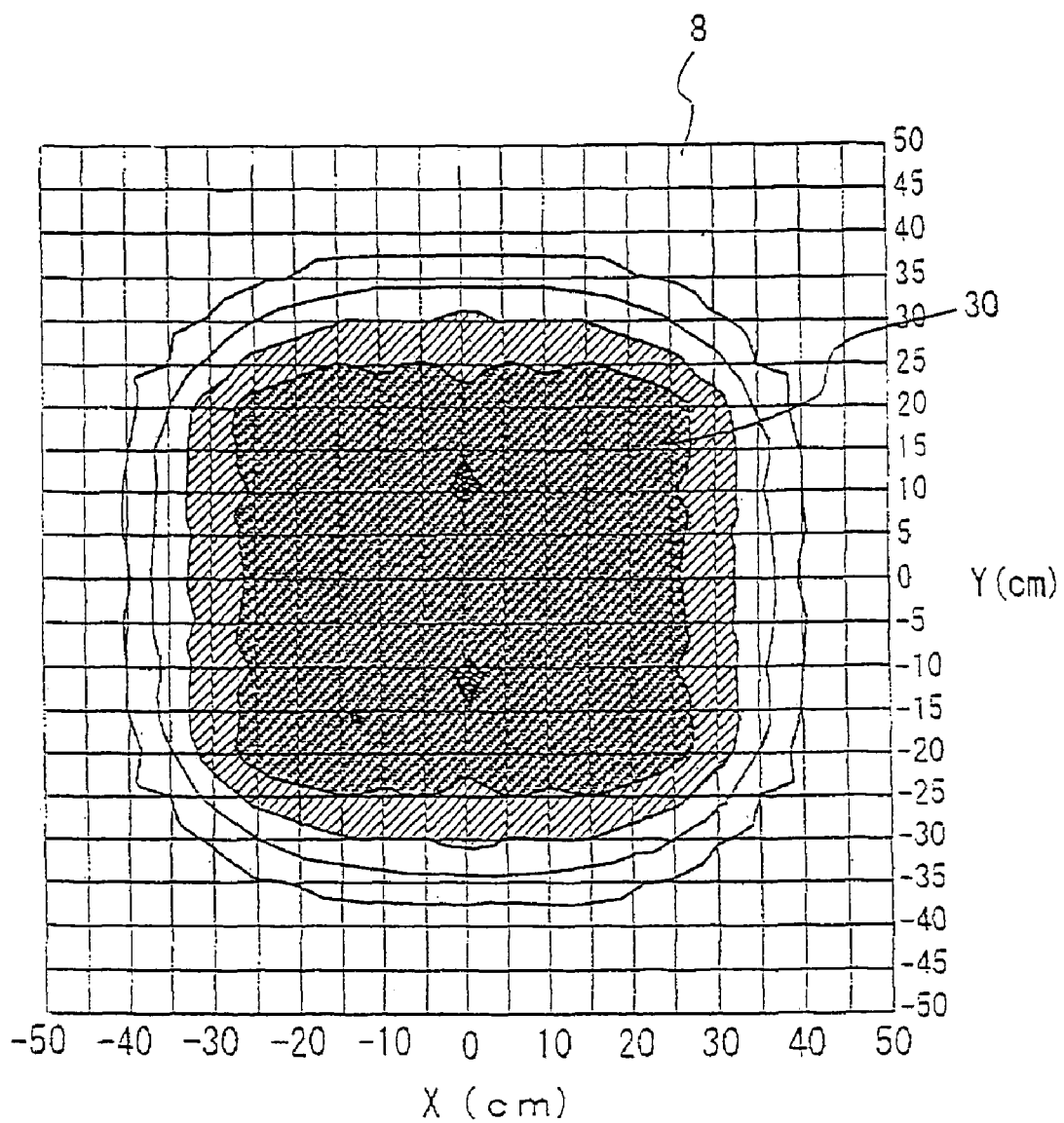
FIG. 12 is a diagram showing an illuminance distribution obtained in a case where a surface-to-be-illuminated is illuminated by an illumination device in accordance with the second embodiment.

Next, a concrete example of this embodiment is described by referring to FIGS. 11a to 11e. FIG. 12 is a diagram showing an illuminance distribution obtained in a case where lens 23 of the concrete example is employed. The following values are examples, putting no limitation on the present invention. In FIG. 11a, values of lens 23 are as follows.

E0; length of each side of square flange portion 26=5 mm

E1; long side of rectangle-like light control emission face 27 (outer profile)=4.439 mm E2; short side of rectangle-like light control emission face 27 (outer profile)=3.64 mm It is noted that four corner portions 31 are provided by ¼ circular parts, respectively. Light control emission face 27 of lens 23 has long and short side outer surfaces which are smoothly connected to each other by curved surfaces corresponds to corner portions 31. In addition, in FIGS. 11(b) to (d), dimensions of lens 23 are as follows.

t1; thickness of flange portion 26=0.5 mm t2; thickness from lower face 24 to top portion P2 of light control emission face 27=1.458 mm Illumination device 21 employing lens 23 of the above values involves distance W from top portion P2 of lens 23 to surface-to-be-illuminated (a plane) 8, which is set so that W=50 cm ((See FIG. 10).

Light H from light emitting element 2 is emitted from light control emission face 27 as to produce no crossover divergently. In addition, a smaller flux density of emission is obtained in the vicinity of optical axis L as compared with that at locations distant from optical axis L. Except for the vicinity of optical axis L, flux density of emission increases gradually away from optical axis L (See FIG. 10).

As a result, illumination device 21 can cause a generally rectangular region-to-be-illuminated 30 having long sides of about 54 mm and short sides of about 50 mm to be illuminated with a generally uniform illuminance (See FIG. 12).

Figure 9:
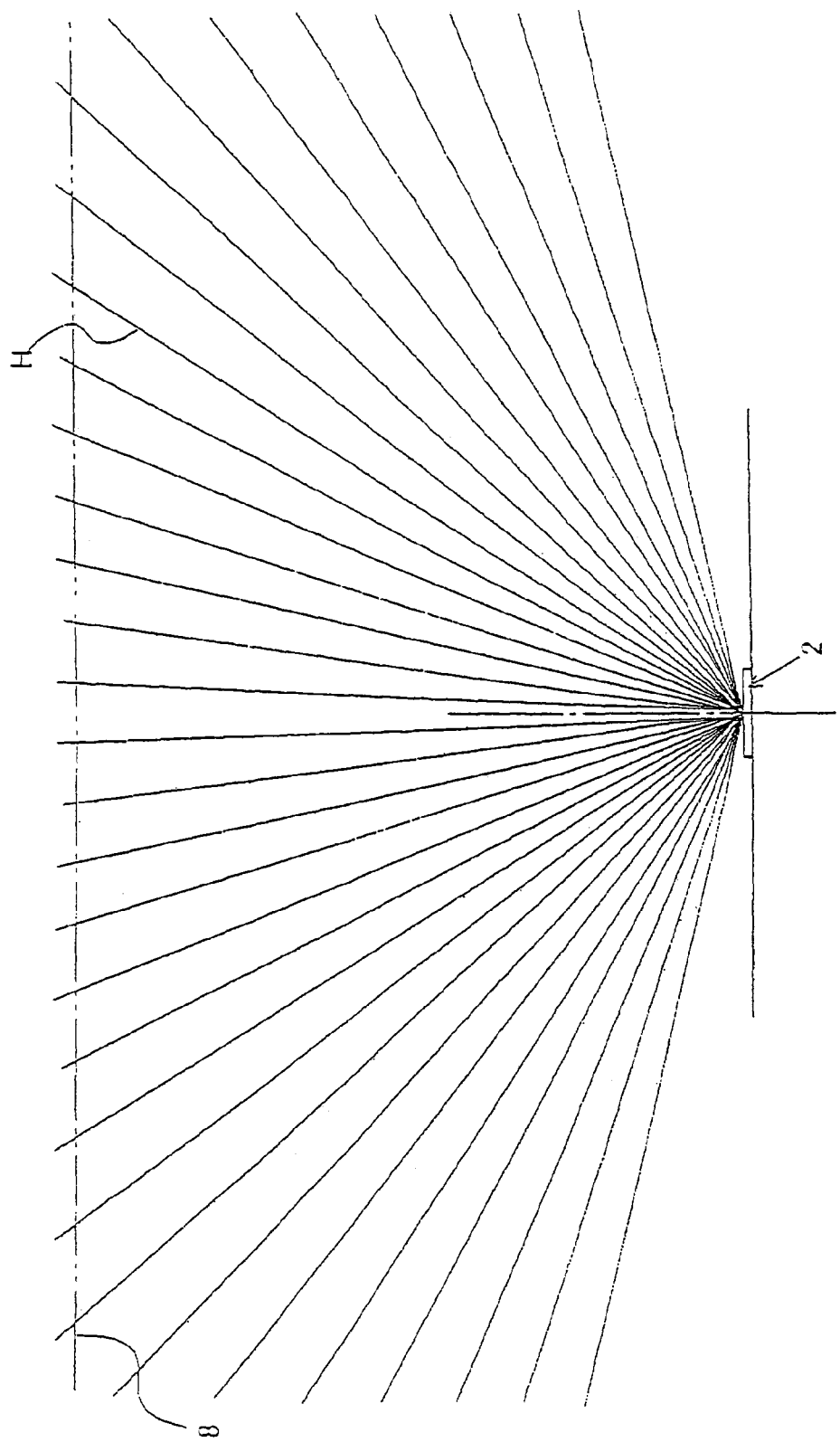
FIG. 9 is a diagramic view of an illumination device (direct illumination without lens) as an example for comparison.
Figure 13A:
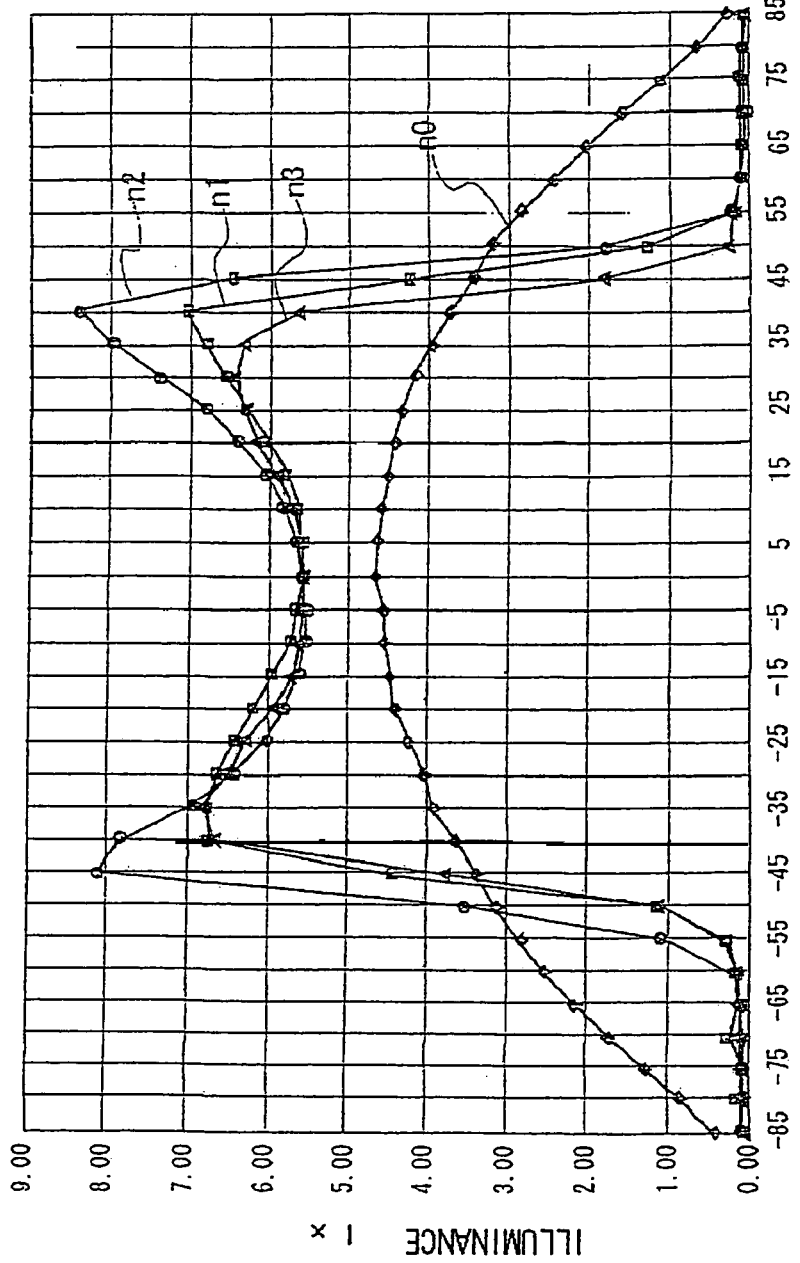
FIGS. 13a and 13b are diagrams showing a relation between viewing angle $\eta$ and illuminance.
Figure 13B:
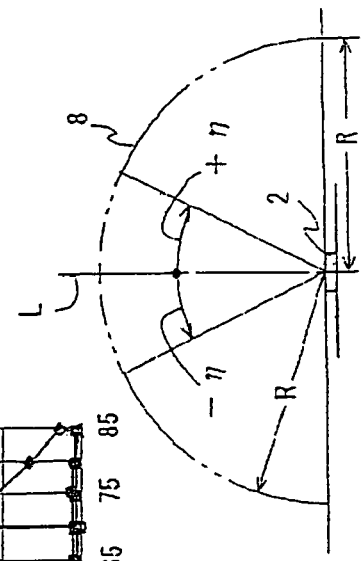

FIG. 13a is a diagram showing a relation between viewing angle and illuminance of illumination device 21 shown in FIG. 10 in contrast with a relation between viewing angle and illuminance of the illumination device shown in FIG. 9 (direct illumination without lens). It is noted that a hemisphere imaginary surface-to-be-illuminated 8' is set at distance R (200 mm) from light emitting element 2 as shown in FIG. 13b in order to define viewing angle.

Angle made by viewing light emitting element 2 from imaginary surface-to-be-illuminated 8' is "viewing angle". Angle η is an angle made by viewing line direction and optical axis L. Angle η can express viewing angle, being called "viewing angle η".

In FIG. 13a, curves n1, n2 and n3 give relations between viewing angle η and illuminance for illumination device 21 under a conditions such that rotation angles φ are equal to 0°, 35° and 90°, respectively.

Further, in FIG. 13a, curves n0 gives a relations between viewing angle η and illuminance for the illumination device shown in FIG. 9. It is noted that viewing angle η of 0° means that viewing position is located on optical axis L.

As shown in FIG. 13a, curve n0 is convex upward. That is, illuminance falls gradually when viewing angle is deviated away from η=0° toward + and − sides, depending on deviation angle.

To the contrary, curves n1~n3 give trapezoid-like shapes. In other words, although illumination device 21 of this embodiment gives sharp changes in ranges of viewing angle η=±30°~±50°, illuminance gives a small change inside thereof, telling that light is gathered within this inside angle range. Higher illuminance is obtained in a limited range of angle η as compared with the illumination device shown in FIG. 9.

As shown by curves n1 to n3 in FIG. 13a, the highest illuminance is observed in ranges of viewing angle η from ±30°~45° (30°~45° and −30°~−45°) in the case of illumination device 21, and illuminance falls gradually according to decreasing of distance from optical axis L. In contrast with this, as shown by curve n0 in FIG. 13a, the highest illuminance is observed at viewing angle η=0° (on optical axis L) in the case of the illumination device shown in FIG. 9, and illuminance falls gradually away from there.

Thus illumination device 21 gives quite different characteristics because of being provided with lens 23 as compared the illumination device, without lens 23, shown in FIG. 9.

As described previously, according to this embodiment direct emission from light control emission face 27 contains no rays which are crosses to each other as least in an illumination-allowing-region. Flux density of emission (illumination light) from light control emission face 27 rises at locations deviated from the direction of optical axis L as compared in the vicinity of optical axis L.

Figure 21:
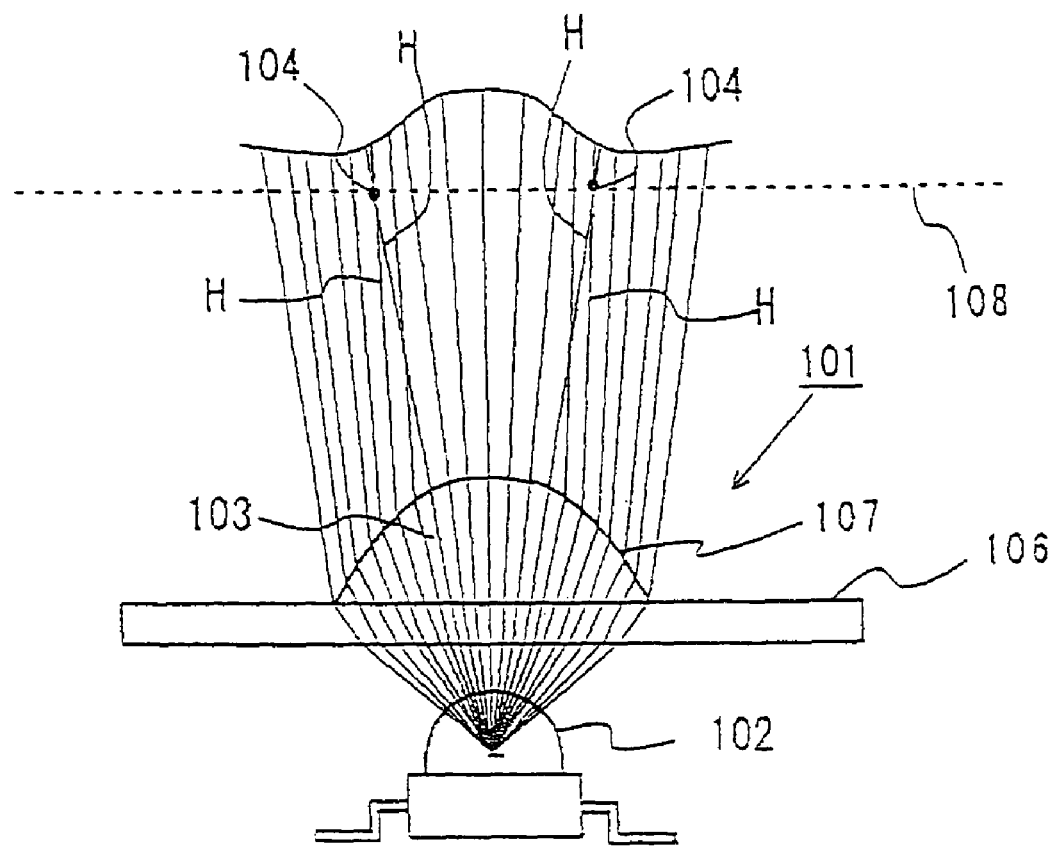
FIG. 21 is a diagramic view of an illumination device in accordance with a prior art.

Therefore, no ring-like local brightening is produced in the illumination-allowing-region. As a result, region-to-be-illuminated 30 in surface-to-be-illuminated 8 CAN BE irradiated by a uniform and efficient light. According to the priors art, as shown in FIG. 21, some rays emitted from emission face 107 of lens 103 cross within an illumination-allowing-region, being apt to producing a rig-like abnormal emission. In addition, according to this embodiment, lens 23 also applies light gathering operation (i.e. function of converging light flux) as a whole to light emitted from light emitting element 2.

Therefore, a reduced quantity of light reaches a part deviated from a desirable region-to-be-illuminated 30, as compared with a case without lens 23 (direct illumination by light emitting element 2). As a result, illumination efficiency of region-to-be-illuminated 30 is improved.

Third Embodiment

Figure 14:
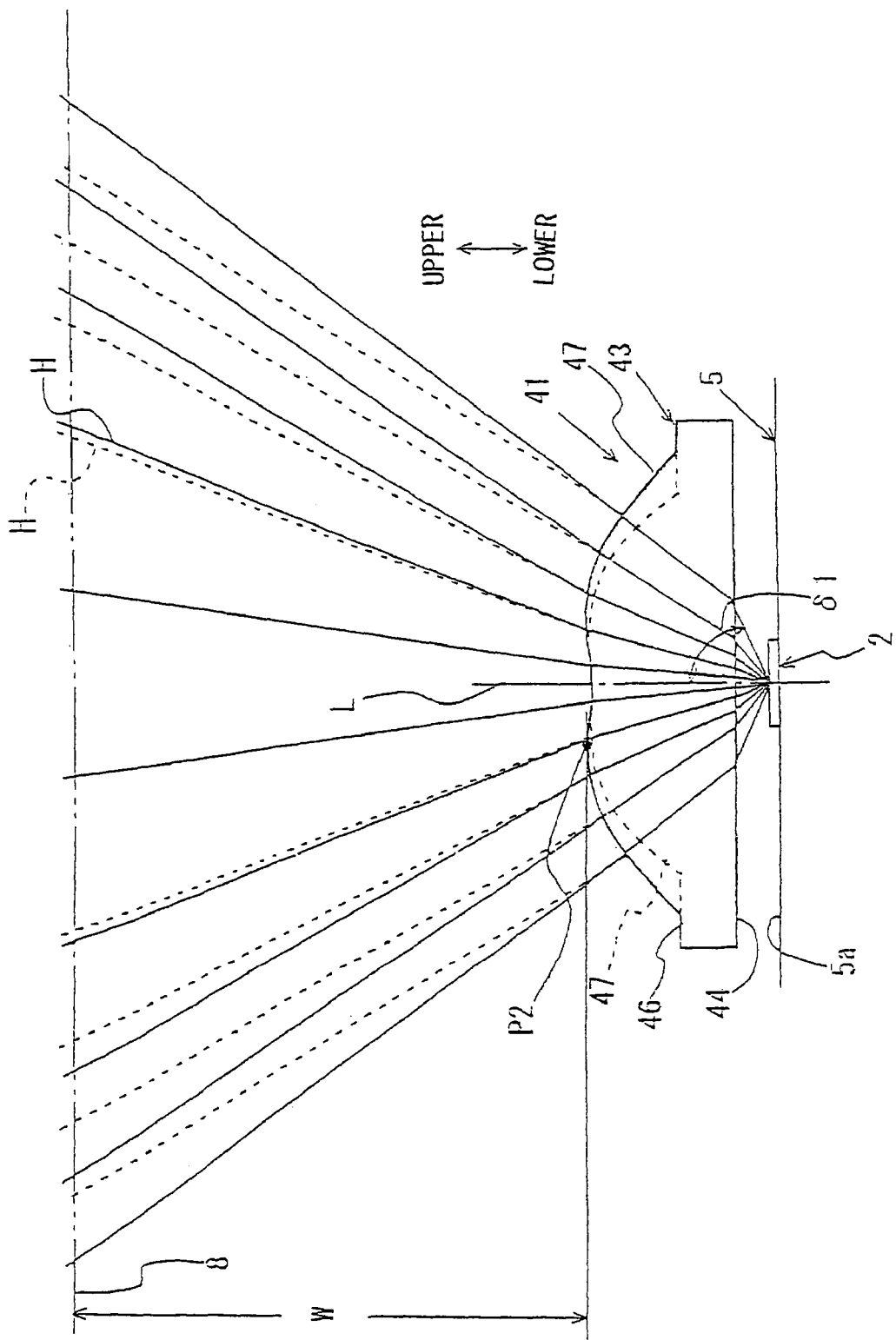
FIG. 14 is a diagramic view of an illumination device in accordance with a third embodiment of the present invention.

FIG. 14 is a diagramic view of illumination device 41 in accordance with a third embodiment of the present invention. Illumination device 41 has lens 43 irradiation characteristics of which are different those of lens 23 employed in the second embodiment (See FIGS. 15 and 12).

Thus lens 43 has light control emission face 47 different from light control emission face 27 of lens 23. Except for this difference, the third embodiment is the same as illumination device 21 of the second embodiment. Therefore, common elements are denoted by the same reference characters and description overlapping that of the second embodiment is omitted.

Figure 15:
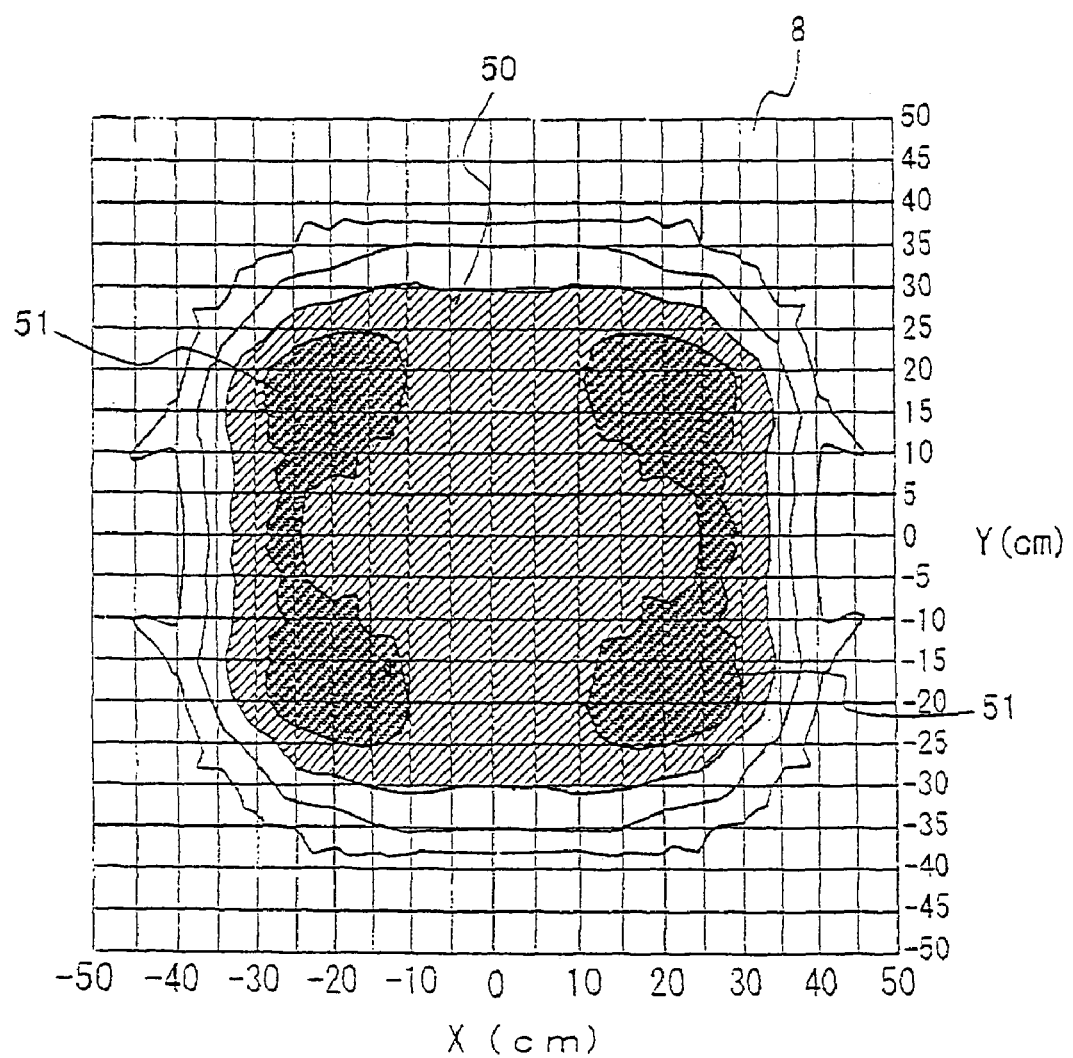
FIG. 15 is a diagram showing an illuminance distribution obtained in a case where a surface-to-be-illuminated is illuminated by an illumination device in accordance with the third embodiment.

Lens 43 employed in this embodiment is structured so that region-to-be-illuminated 50 has a higher illuminance in vicinity-of-periphery-portion 51 as compared with a center portion of region-to-be-illuminated 50, as shown in FIG. 15. Features of lens 43 are described below by comparing with lens 23.

Lens 43 may be made of the same material as that of lens 23 or 23.

Lens 43 shows a different relation between rotation angle φ (See FIG. 6) limit angle θ' (limit value of θ5) as shown by curve m3 in FIG. 7 as compared with the case of lens 23 shown in FIG. 11.

That is, while lens 43 has θa 38°, lens 23 has θa 40°. In addition, lens 43 gives a higher illuminance to vicinity-of-periphery-portions 51, 51 of region-to-be-illuminated 50 as compared with the center portion of region-to-be-illuminated 50. For realizing this, a greater value of constant k (k=3.5) is set for lens 43 as compared with that set for lens 23 (k=2.5), wherein value of k is used in the foresaid Formula 1.

Seeing correction quantity θb, there is no difference between lens 43 and lens 23 as shown in FIG. 7. In addition, Seeing correction quantity θc, there is no difference between lens 43 and lens 23, too. As previously described, correction quantity θb is a correction quantity to be applied to θa=38° of limit angle θ' under a condition that rotation angle φ=0°. Further, correction quantity θc is a correction quantity to be applied to limit angle θ' under a condition that rotation angle φ=90° (θb=1.5°, θc=2.5°).

Still further, θa is a limit value of θ5 under rotation angle φa corresponding to a diagonal, Conditions as above can be applied to the foresaid Formula 3 and Formula 4 to calculate θ' under any rotation angle φ for lens 43. Then, applying the calculated θ' to the foresaid Formula 1 and Formula 2, θ5 corresponds to any θ1 can be calculated. Thus, if θ5 calculated according to Formula 1 is applied to Formula 2 in this embodiment, θ3 corresponds to any θ1 can be calculated.

FIGS. 4 and 5 illustrate relations between θ5, θ3 and θ1 which are calculated according to the foresaid Formulae 1 to 4 as described above.

FIG. 4 illustrates relations between θ1 and θ5, through which travelling directions of rays emitted from light control emission face 47 are determined. It is noted that line curve G0 expresses a line of (θ5/θ1)=1.

Seeing curves G4 to G6 giving relations between θ1 and θ5, curve G4 gives a relation between θ1 and θ5 under rotation angle φ=0° and curve G5 gives a relation between θ1 and θ5 under rotation angle φ=35°. Curve G6 gives a relation between θ1 and θ5 under rotation angle φ=90°.

Seeing curve G4 of curves G4 to G6, except for light of the vicinity of optical axis L, (θ5/θ1)>1 is satisfied in a range of incidence angle θ1 from the vicinity of optical axis L to a certain angle α1. Further, (θ5/θ1)<1 is satisfied if incidence angle θ1 is greater than angle α1.

Seeing curve G5, except for light of the vicinity of optical axis L, (θ5/θ1)>1 is satisfied in a range of incidence angle θ1 from the vicinity of optical axis L to a certain angle α2. Further, (θ5/θ1)<1 is satisfied if incidence angle θ1 is greater than angle α2.

Seeing curve G6, except for light of the vicinity of optical axis L, (θ5/θ1)>1 is satisfied in a range of incidence angle θ1 from the vicinity of optical axis L to a certain angle α3. Further, (θ5/θ1)<1 is satisfied if incidence angle θ1 is greater than angle α3.

In addition, seeing certain angles α1~α3 at which the curves cross with the line of (θ5/θ1)=1, respectively, a relation of α3<α2<α1 is satisfied. Curves G4 to G6 are smooth curves swelling upward.

Curve G4 gives the maximum value of θ' of θ5 equal to 38°. Curve G5 gives the maximum value of θ' of θ5 equal to 35°. Curve G6 gives the maximum value of θ' of θ5 equal to 33°.

FIG. 5 illustrates relations between θ1 and θ3, through which configuration of light control emission face 47 of lens 43 is determined.

Seeing curves F4 to F6 giving relations between θ1 and θ3, curve F5 gives a relation between θ1 and θ3 under rotation angle φ=0°. Curve F4 gives a relation between θ1 and θ3 under rotation angle φ=35° and curve F6 gives a relation between θ1 and θ3 under rotation angle φ=90°. Each of curves F4 to F6 has two points of inflection. Seeing curve F4 of curves F4 to F6, θ3<0° is satisfied in a range of θ1<ϵ1 and θ3>0° is satisfied in a range of θ1>ϵ1. Seeing curve F5, θ3<0° is satisfied in a range of θ1<ϵ2 and θ3>0° is satisfied in a range of θ1>ϵ2. Seeing curve F6, θ3<0° is satisfied in a range of θ1<ϵ3 and θ3>0° is satisfied in a range of θ1>ϵ3.

Light control emission face 47 of lens 43 is configured so that a relation of ϵ3<ϵ2<ϵ1 is satisfied. Curves F4 to F6 in the third embodiment show greater changes as compared with curves F1 to F3 in the second embodiment. It is noted that light control emission face 47 provides a smooth recess sinking downward (concave surface) in a range of θ3<0°.

As described above, lens 43 embodiment in this embodiment is provided with light control emission face 47 configuration of which has features illustrated in FIGS. 4 and 5. Therefore, vicinity-of-periphery-portions 51, 51 of region-to-be-illuminated 50 can have a higher illuminance as compared with lens 23 employed in the second embodiment. In addition, illuminate in vicinity-of-periphery-portions 51, 51 of region-to-be-illuminated 50 can be made greater than that of the center portion of region-to-be-illuminated 50.

As a result, illumination device 41 of this embodiment can not only give a uniform illuminance to the center portion of region-to-be-illuminated 50 in generally the same way as illumination device 21 but also give a higher illuminance to vicinity-of-periphery-portions 51, 51 of region-to-be-illuminated 50 as compared with that of the center portion.

Therefore, if a camera has a lens of characteristics of "bright in a center portion and dark in a periphery portion", the present invention is applied advantageously. That is, a shortage of lens (dark in a periphery portion) can be compensated by region-to-be-illuminated 41. It is noted that It is noted that light control emission face 47 of lens 43 is shown by dotted line in FIG. 14, giving a profile on a cross section of rotation angle φ=90°.

Modifications of the First to Third Embodiments

Each of lenses 3, 23, 43 has a planar lower face 4, 24, 44. However, this does not limit the scope of the present invention.

Figure 16:
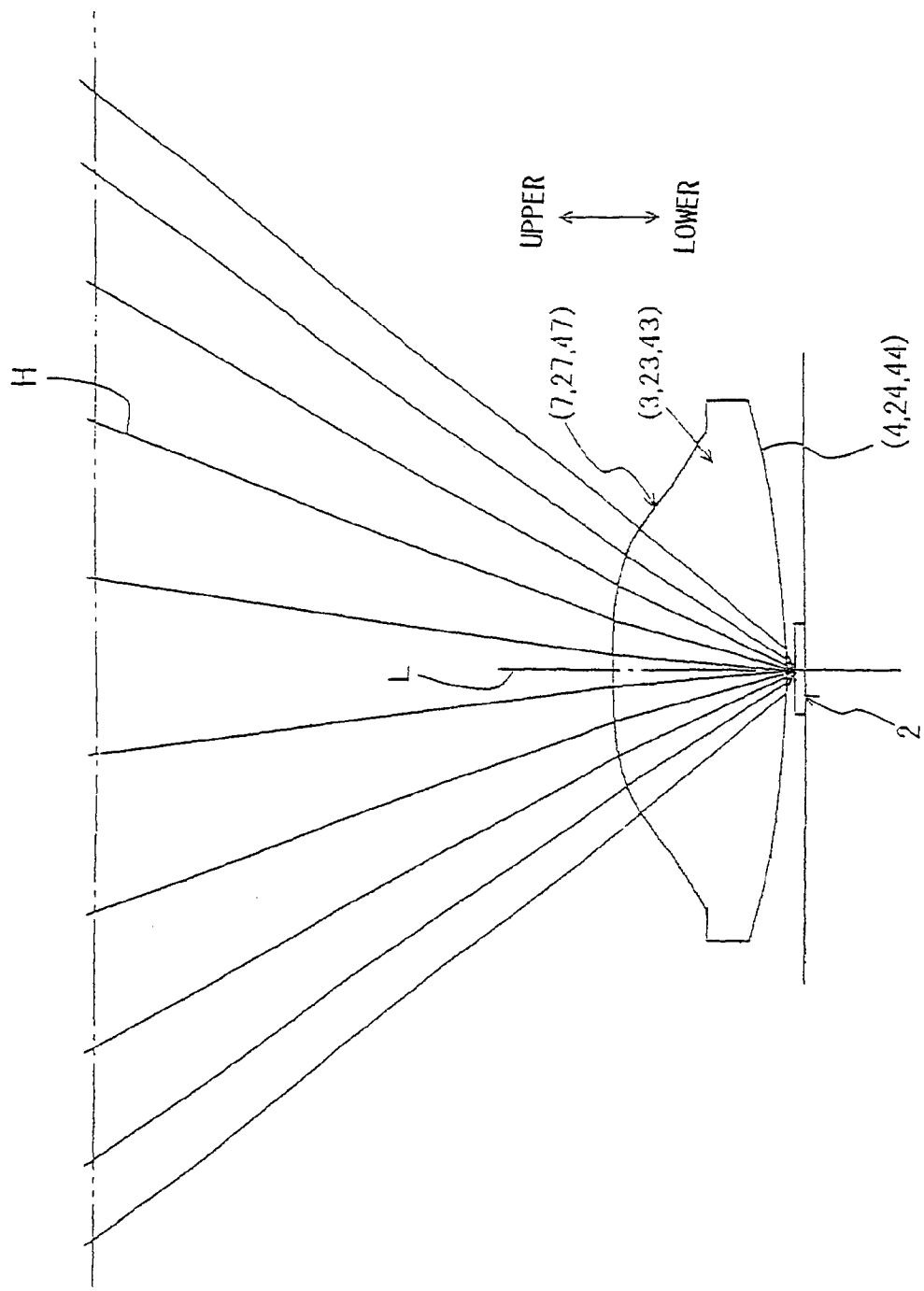
FIG. 16 is a diagramic view of an illumination device in accordance with a first modification of the first to third embodiments.

For example, lower faces 4, 24, 44 may be convex as shown in FIG. 16. Instead, lower faces 4, 24, 44 may be concave as shown in FIG. 17.

Figure 17:
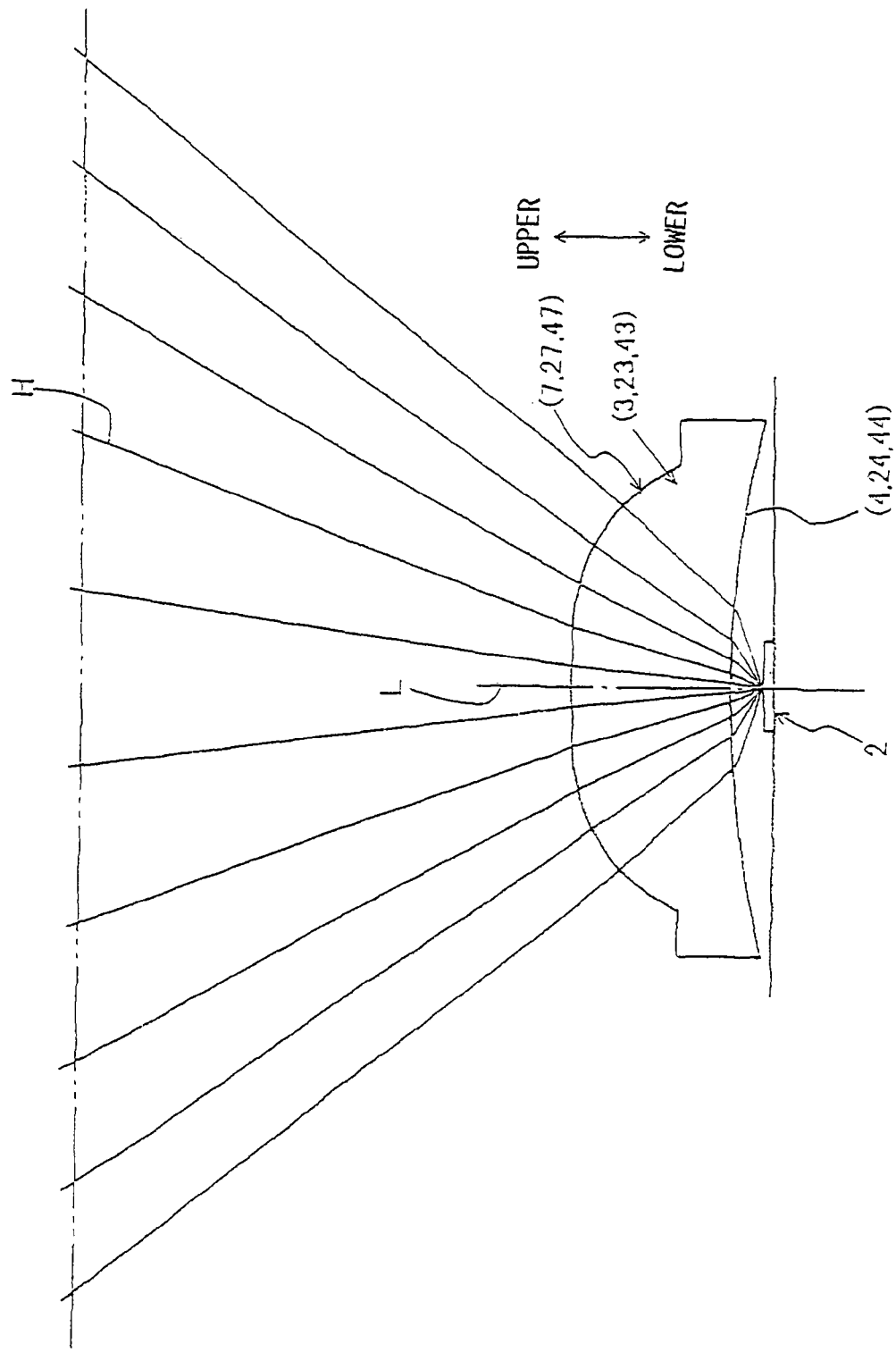
FIG. 17 is a diagramic view of an illumination device in accordance with a second modification of the first to third embodiments.

If lenses 3, 23, 43 have convex lower faces 4, 24, 44, it is possible to gather light H emitted from light emitting element 2 around optical axis L, after entering into lenses 3, 23, 43 as compared with cases the lower faces are planar, If lenses 3, 23, 43 have concave lower faces 4, 24, 44, it is possible to introduce light H emitted from light emitting element 2 into lenses 3, 23, 43 more efficiently and to supply light to locations farther from optical axis L, as compared with cases the lower faces are planar, If light control emission faces 7, 27, 47 of lenses 3, 23, 43 shown in FIGS. 16 and 17 are configured according to generally same idea as idea according to which foredescribed light control emission faces 7, 27, 47 of lenses 3, 23, 43 are configured, similar effects are performed.

Forth Embodiment

Figure 18:
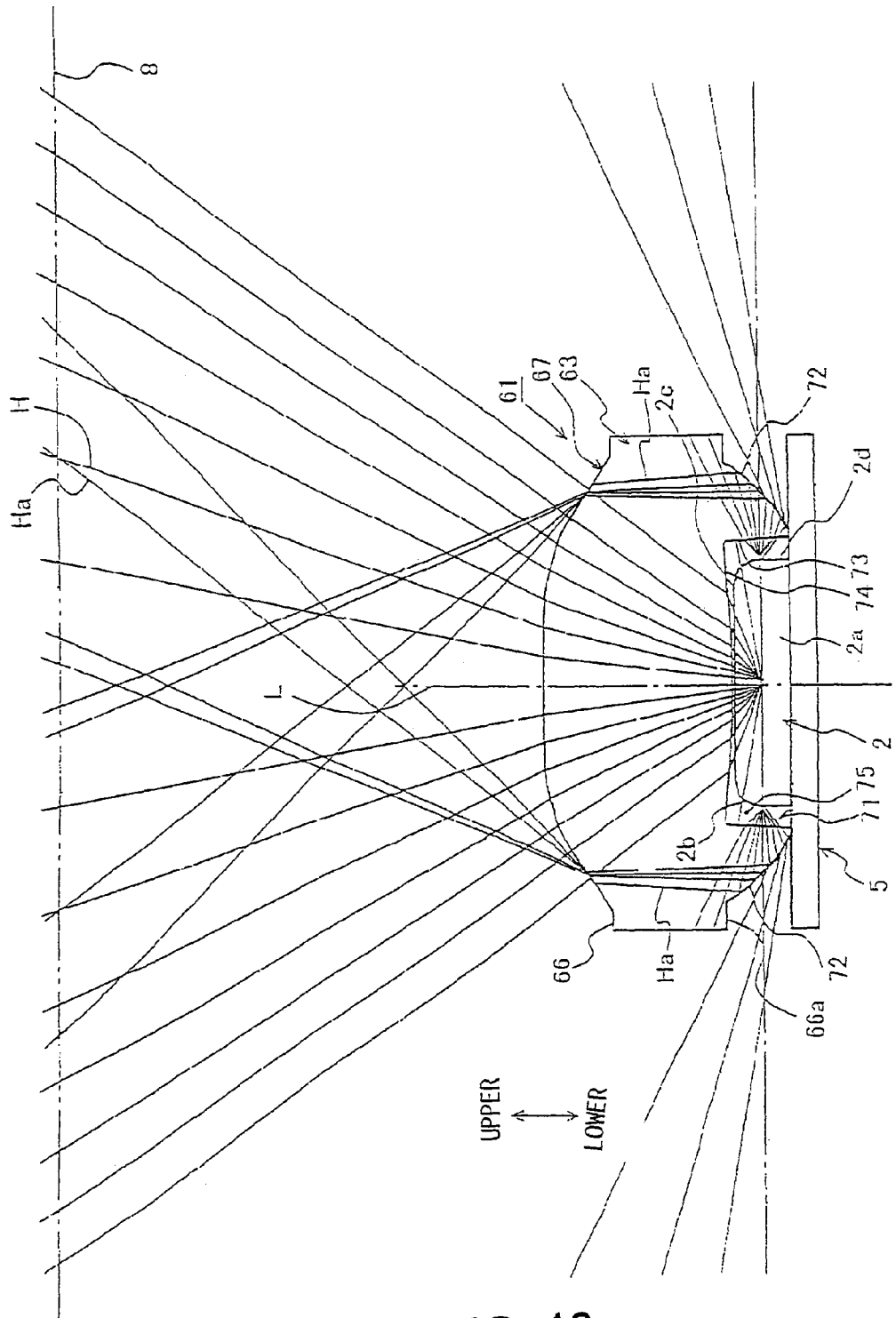
FIG. 18 is a diagramic view of an illumination device in accordance with a forth embodiment of the present invention.

FIG. 18 shows illumination device 61 In addition, the forth embodiment of the present invention. FIGS. 19a, 19b show lens 63 employed in illumination device 61.

As shown in FIG. 18, light H from light emitting element 2 is outputted vis lens 63. Light emitting element 2 includes LED (not shown) an outer face of which is covered by resin, being mounted on substrate 5 so that light emitting portion 2a is projected.

Light emitting portion 5a is circular in plan and has rectangle-like side shapes. Light emitting portion 5a is generally like a disk as a whole. It is noted that light emitting element 2 has a periphery edge portion formed with smoothly curved face 2b which connects upper face 2c with side faces (periphery) smoothly.

Figure 19C:
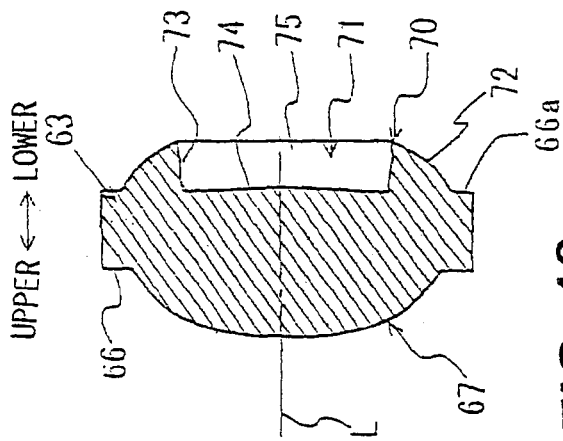
Figure 19A:
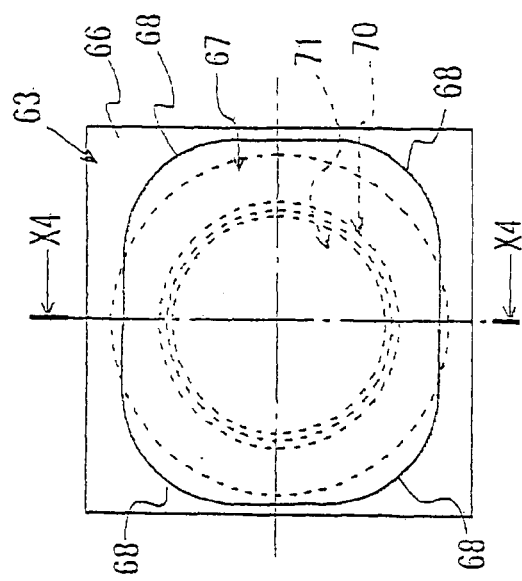
FIG. 19a is a plan view of a lens employed in the illumination device shown in FIG. 18.
Figure 19B:
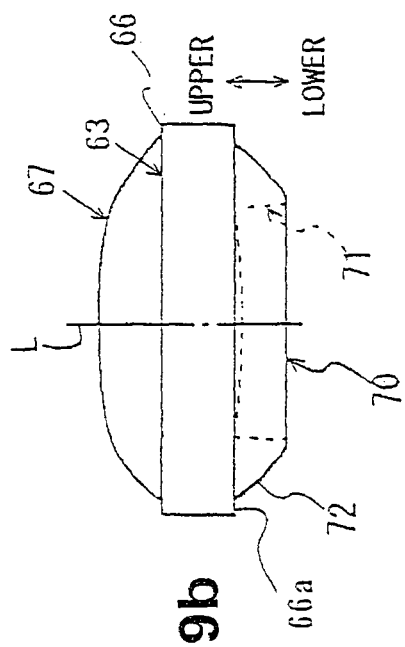
FIG. 19b is a side view of the same lens.

Lens 63 is square in plan as shown in FIG. 19. Shape of light control emission face 67 opposite to surface-to-be-illuminated 8 is generally the same as that of lens 23, being formed as to provide a rectangle-like shape inside of flange portion 66. It is noted that a plan shape of light control emission face 67 has four corner portions 68 each of which is provided by an arc-like round part.

Lens 63 has lower projecting portion 70 at the lower side of flange portion 66 as shown in FIGS. 18 and 19. Projecting portion 70 formed at the lower side of flange portion 66 has a conical-plateau-like configuration. This conical-plateau-like configuration has diameter decreasing as to come nearer to optical axis L away from lower face 66a of flange portion 66 downward (in a direction along optical axis L), coming nearer to optical axis L.

Lower projecting portion 70 has a recess 71 opened downward to accommodate light emitting portion 2a and reflection face 72 for reflecting light Ha from side faces of light emitting portion 2a toward light control emission face 67.

Reflection face 72 provide by a curved surface swelling toward the outside of lens 63, functioning as to gather the reflected light onto a limited region located just above in light control emission face 67. Recess 71 has a circle-like shape generally similar to light emitting portion 2a of light emitting element 2 (See FIG. 19a), being provided a tapered side face 73 having diameter gradually increasing away from bottom face 74 to an opening end (See FIGS. 18 and 19s, 19b).

Bottom face 74 provide a convex configuration swelling downward in FIG. 18. Bottom face 74 and side face 73 of recess 71 provide incidence surfaces for light H and Ha from light emitting element 2.

Generally circular light emitting portion 2a is accommodated ion inner space 75 of recess 71.

Lens 63 of such structure allows light H emitted from the side of upper face 2c of light emitting portion 2a to enter into lens 63 through bottom face (incidence face) 74. In addition, light Ha emitted from the side of side face (periphery face) 2d of light emitting portion 2a enters into lens 63 through side face 73 of recess 71.

In the case of illumination device 61, seeing only light H entering into lens 63 through bottom face 74 of recess 71, the entering light provide direct emission from light control emission face 67 (without undergoing inner reflection at a lens surface). This light H is emitted from various points on light control emission face 67, being supplied to surface-to-be-illuminated 8 without crossing on the way.

Illumination device 61 can irradiate surface-to-be-illuminated 8 uniformly in generally the same manner as illumination device 21 of the second embodiment with the above directly emitted light H.

Next, let see only light Ha entering into lens 63 through side face 73 of recess 71. This light Ha is reflected by reflection face 72 to provide light reaching light control emission face 67.

This light is emitted from light control emission face 67 divergently. If light Ha emitted from lens 63 is called "indirect emission Ha", illumination device 61 makes an illuminance distribution made by direct emission H and another illuminance distribution made by indirect emission Ha overlapped. Therefore, a higher illuminance of illumination is obtained as compared with illumination device 21 of the second embodiment.

Modifications of the Forth Embodiment

Reflection face 72 of lens 63 shown in FIG. 18 is provided by a smoothly curved surface having no inflection point. However, this is merely an example.

Figure 20A:
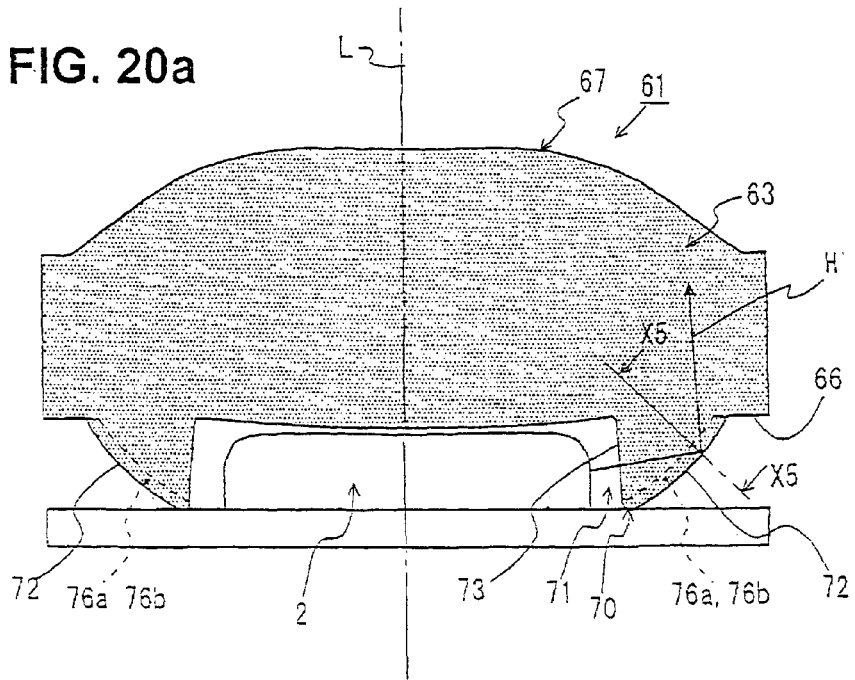
FIG. 20a is a diagramic view of an illumination device in accordance with a modification of the forth embodiments.
Figure 20B:
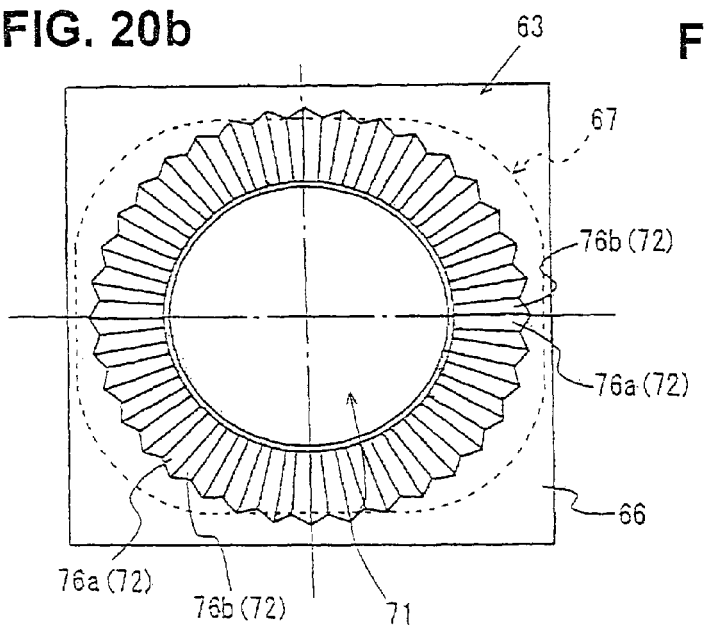
FIG. 20b is a plan view of a lens employed in the illumination device shown in FIG. 20a, as viewed from lower face side.
Figure 20C:
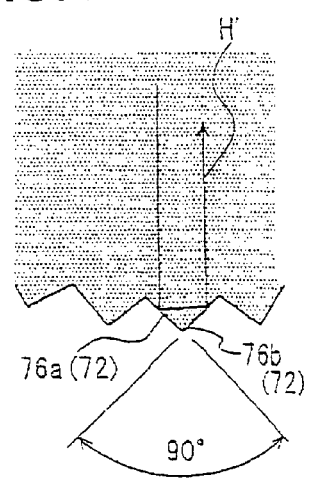

For example, as shown in FIGS. 20*a* to 20*c*, reflection face 72 may be formed of prismatic face 76*a*, 76*b*. If so, inner incidence light H' to reflection face 72 is reflected twice by prism face 76*a*, 76*b*, being directed to light control emission face 67 efficiently. As a result, a n increased light quantity of illumination light can be outputted from light control emission face 67.

That is, if reflection face 72 is formed of prismatic face 76*a*, 76*b* instead in the forth embodiment, light after entering into lens 63 through side face 73 and reaching reflection face 72 (prismatic face 76*a*, 76*b*) is inner-reflected by reflection face 72 (prismatic face 76*a*, 76*b*), being directed to light control emission face 67 efficiently.

It is noted that light path of light H' shown by thick kine in FIG. 20*a* is projected onto a cross section along X5-X5 in FIG. 20*c*. It is understood from this illustration that reflection is effected twice at prismatic face 76*a*, 76*b* providing reflection face 72 and light H' is deflected efficiently.

Other Embodiments

In the cases of above embodiments, illumination device 1 gives a generally circular irradiation area in surface-to-be-illuminated 8 and illumination devices 21, 41 and 61 give generally rectangular irradiation areas in surface-to-be-illuminated 8. However, this does not limit the scope of the present invention.

For example, the present invention can be applied to illumination devices give various areas like star-shapes, triangles, squares, pentagon, hexagon or others in surface-to-be-illuminated 8.

The invention claimed is:

1. An illumination device, comprising:
a point-like light source emitting light; and
a lens receiving the light emitted from said point-like light source and emitting the light as illumination light illuminating a region-to-be-illuminated, said lens having a flat incidence face directed to said point-like light source and a light control emission face that is located opposite to said flat incidence face, the lens emitting rays which reach said light control emission face after being emitted from said point-like light source, the rays entering into said lens through said flat incidence face and travelling only within said lens without undergoing inner-reflection at any surface of said lens as said illumination light, said light control emission face having a configuration such that no crossover is given by rays included in said illumination at least before said illumination light reaches said region-to-be-illuminated, said light control emission face including a first emission face and a second emission face connected continuously with and surrounding the first emission face, the first emission face being smoothly concavely curved from a connection portion between the first emission face and the second emission face, the second emission face being smoothly convexly curved from the connection portion to an outer edge of the light emission face, and light flux density of said illumination light is lower in a direction-range-near-to-optical-axis including a direction of an optical axis of said point-like light source as compared with that in a direction range outside of said direction-range-near-to-optical-axis, the first emission face smoothly concavely curved and the second emission face smoothly convexly curved providing curvature such that the emission direction characteristics are expressed by the following formula, $$\theta 5 = [1 - \{((\pi/2) - \theta 1)/(\pi/2)\}^k] \times \theta',$$

where $\theta 1$ is an incidence angle within the half-intensity-angular-range, the incidence angle $\theta 1$ being an incidence angle defined as an angle made by light from a light emitting element and an optical axis, $\theta 5$ being an emission angle defined as an angle of light being emitted from the light control emission face, $\theta'$ being an angle giving the maximum of $\theta 5$, and k being a constant larger than 1 for expressing a difference in illuminance between a center portion and a periphery portion of the region-to-be-illuminated.

2. An illumination device, comprising:
a point-like light source emitting light; and
a lens receiving the light emitted from said point-like light source and emitting the light as illumination light illuminating a region-to-be-illuminated, said lens having an incidence face directed to said point-like light source and a light control emission face located opposite to said incidence face, the lens emitting rays which reach said light control emission face after being emitted from said point-like light source, the rays entering into said lens through said incidence face and travelling only within said lens without undergoing inner-reflection at any surface of said lens as said illumination light, said light control emission face having a configuration such that no crossover is given by rays included in said illumination at least before said illumination light reaches said region-to-be-illuminated, and further having a first emission face and a second emission face connected continuously with and surrounding the first emission face, the first emission face being smoothly concavely curved from a connection portion between the first emission face and the second emission face, the second emission face swelling toward said region-to-be-illuminated directly from an outer edge of said light control emission face and being smoothly convexly curved from the connection portion to the outer edge of the light emission face, the first emission face smoothly concavely curved and the second emission face smoothly convexly curved providing curvature such that the emission direction characteristics are expressed by the following formula, $$\theta 5 = [1 - \{((\pi/2) - \theta 1)/(\pi/2)\}^k] \times \theta',$$

where $\theta 1$ is an incidence angle within the half-intensity-angular-range, the incidence angle $\theta 1$ being an incidence angle defined as an angle made by light from a light emitting element and an optical axis, $\theta 5$ being an emission angle defined as an angle of light being emitted from the light control emission face, $\theta'$ being an angle giving the maximum of θ5, and k being a constant larger than 1 for expressing a difference in illuminance between a center portion and a periphery portion of the region-to-be-illuminated.

3. A lens used in an illumination device which applies direction-control to light emitted from a point-like light source and emits direction-controlled illumination light illuminating a region-to-be-illuminated, for said direction-control, wherein:

said lens has a flat incidence face directed to said point-like light source and a light control emission face that is located opposite to said incidence face, the lens emitting rays which reach said light control emission face after being emitted from said point-like light source and entering into said lens through said flat incidence face and travelling only within said lens without undergoing inner-reflection at any surface of said lens as said illumination light, and said light control emission face has a configuration such that no crossover is given by rays included in said illumination at least before said illumination light reaches said region-to-be-illuminated, said light control emission face including a first emission face and a second emission face connected continuously with and surrounding the first emission face, the first emission face being smoothly concavely curved from a connection portion between the first emission face and the second emission face, the second emission face being smoothly convexly curved from the connection portion to an outer edge of the light emission face, and light flux density of said illumination light is lower in a direction-range-near-to-optical-axis including a direction of an optical axis of said point-like light source as compared with that in a direction range outside of said direction-range-near-to-optical-axis, the first emission face smoothly concavely curved and the second emission face smoothly convexly curved providing curvature such that the emission direction characteristics are expressed by the following formula, θ5=[1−{((π/2)−θ1)/(π/2)}$^k$]×θ', where θ1 is an incidence angle within the half-intensity-angular-range, the incidence angle θ1 being an incidence angle defined as an angle made by light from a light emitting element and an optical axis, θ5 being an emission angle defined as an angle of light being emitted from the light control emission face, θ' being an angle giving the maximum of θ5, and k being a constant larger than 1 for expressing a difference in illuminance between a center portion and a periphery portion of the region-to-be-illuminated.

4. A lens used in an illumination device which applies direction-control to light emitted from a point-like light source and emits direction-controlled illumination light illuminating a region-to-be-illuminated, for said direction-control, wherein:

said lens has an incidence face directed to said point-like light source and a light control emission face that is located opposite to said incidence face, the lens emitting rays which reach said light control emission face after being emitted from said point-like light source and entering into said lens through said incidence face and travelling only within said lens without undergoing inner-reflection at any surface of said lens as said illumination light, and said light control emission face has a configuration such that no crossover is given by rays included in said illumination at least before said illumination light reaches said region-to-be-illuminated, and further having a first emission face and a second emission face connected continuously with and surrounding the first emission face, the first emission face being smoothly concavely curved from a connection portion between the first emission face and the second emission face, the second emission face swelling toward said region-to-be-illuminated directly from an outer edge of said light control emission face and being smoothly convexly curved from the connection portion to the outer edge of the light emission face, the first emission face smoothly concavely curved and the second emission face smoothly convexly curved providing curvature such that the emission direction characteristics are expressed by the following formula, θ5=[1−{((π/2)−θ1)/(π/2)}$^k$]×θ', where θ1 is an incidence angle within the half-intensity-angular-range, the incidence angle θ1 being an incidence angle defined as an angle made by light from a light emitting element and an optical axis, θ5 being an emission angle defined as an angle of light being emitted from the light control emission face, θ' being an angle giving the maximum of θ5, and k being a constant larger than 1 for expressing a difference in illuminance between a center portion and a periphery portion of the region-to-be-illuminated.

5. An illumination device, comprising:

a light source emitting a light;

a lens receiving the light emitted from the light source, the light emitted from the light source entering the lens through a flat incident face, travelling through the lens, and then being emitted through a light control emission face that is located opposite to the incidence face, the light control emission face including a first emission face and a second emission face connected continuously with and surrounding the first emission face, the first emission face being smoothly concavely curved from a connection portion between the first emission face and the second emission face, the second emission face being smoothly convexly curved from the connection portion to an outer edge of the light emission face, the light control emission face having a light flux density of the light lower in a direction-range-near-to-optical-axis including a direction of an optical axis of said point-like light source as compared with that in a direction range outside of said direction-range-near-to-optical-axis, the first emission face smoothly concavely curved and the second emission face smoothly convexly curved providing curvature such that the emission direction characteristics are expressed by the following formula, θ5=[1−{((π/2)−θ1)/(π/2)}$^k$]×θ', where θ1 is an incidence angle within the half-intensity-angular-range, the incidence angle θ1 being an incidence angle defined as an angle made by light from a light emitting element and an optical axis, θ5 being an emission angle defined as an angle of light being emitted from the light control emission face, θ' being an angle giving the maximum of θ5, and k being a constant larger than 1 for expressing a difference in illuminance between a center portion and a periphery portion of the region-to-be-illuminated.

6. An illumination device, comprising:

a light source emitting a light;

a lens receiving the light emitted from the light source, the light emitted from the light source entering the lens through an incident face, travelling through the lens, and then being emitted through a light control emission face that is located opposite to the incidence face, the light control emission face including a first emission face and a second emission face connected continuously with and surrounding the first emission face, the first emission face being smoothly concavely curved from a connection portion between the first emission face and the second emission face, the second emission face swelling toward said region-to-be-illuminated directly from an outer edge of the light control emission face and being smoothly convexly curved from the connection portion to the outer edge of the light emission face, the first emission face smoothly concavely curved and the second emission face smoothly convexly curved providing curvature such that the emission direction characteristics are expressed by the following formula.

$$\theta 5 = [1 - \{((\pi/2) - \theta 1)/(\pi/2)\}^k] \times \theta',$$

where $\theta 1$ is an incidence angle within the half-intensity-angular-range, the incidence angle $\theta 1$ being an incidence angle defined as an angle made by light from a light emitting element and an optical axis, $\theta 5$ being an emission angle defined as an angle of light being emitted from the light control emission face, $\theta'$ being an angle giving the maximum of $\theta 5$, and k being a constant larger than 1 for expressing a difference in illuminance between a center portion and a periphery portion of the region-to-be-illuminated.

* * * * *